(12) United States Patent
Mueller et al.

(10) Patent No.: US 8,125,058 B2
(45) Date of Patent: Feb. 28, 2012

(54) FARADAY CAGE FOR CIRCUITRY USING SUBSTRATES

(75) Inventors: Tyler Mueller, Phoenix, AZ (US); Larry E. Tyler, Mesa, AZ (US); Geoffrey Batchelder, Chandler, AZ (US); Paul F. Gerrish, Phoenix, AZ (US); Michael F. Mattes, Chandler, AZ (US); Anna J. Malin, Mesa, AZ (US)

(73) Assignee: Medtronic, Inc., Minneapolis, MN (US)

( * ) Notice: Subject to any disclaimer, the term of this patent is extended or adjusted under 35 U.S.C. 154(b) by 378 days.

(21) Appl. No.: 12/569,525

(22) Filed: Sep. 29, 2009

(65) Prior Publication Data

US 2010/0314726 A1 Dec. 16, 2010

Related U.S. Application Data

(60) Provisional application No. 61/235,745, filed on Aug. 21, 2009, provisional application No. 61/229,869, filed on Jul. 30, 2009, provisional application No. 61/229,867, filed on Jul. 30, 2009, provisional application No. 61/185,881, filed on Jun. 10, 2009.

(51) Int. Cl.
*H01L 23/552* (2006.01)

(52) U.S. Cl. ........ 257/659; 361/764; 361/772; 361/773; 361/774; 361/782; 361/783; 361/784; 361/807; 361/810

(58) Field of Classification Search .......... 361/772–774, 361/764, 782–784, 807–810; 257/659
See application file for complete search history.

(56) References Cited

U.S. PATENT DOCUMENTS

| 3,388,301 A | 6/1968 | James |
| 3,943,557 A | 3/1976 | Frazee et al. |
| 4,224,565 A | 9/1980 | Sosniak et al. |
| 4,285,002 A | 8/1981 | Campbell |

(Continued)

FOREIGN PATENT DOCUMENTS

EP 1 128 174 A2 8/2001

OTHER PUBLICATIONS

U.S. Appl. No. 13/016,363, filed Jan. 28, 2011, Mattes et al.

(Continued)

*Primary Examiner* — Tuan T Dinh
*Assistant Examiner* — Mukund G Patel
(74) *Attorney, Agent, or Firm* — Carol F. Barry; Stephen W. Bauer; Evans M. Mburu

(57) ABSTRACT

An apparatus and method uses a first Faraday cage portion and a second Faraday cage portion to provide a Faraday cage enclosure surrounding at least one circuit device. For example, the first Faraday cage portion may include a first conductive portion of a Faraday cage enclosure surrounding the at least one circuit device, and a second Faraday cage portion may include a second conductive portion of the Faraday cage enclosure surrounding the at least one circuit device. Further, for example, the first Faraday cage portion may include a connection surface having one or more conductive contact portions terminating the first conductive portion of the Faraday cage enclosure the second Faraday cage portion may include a connection surface having one or more conductive contact portions terminating the second conductive portion of the Faraday cage enclosure. An electrical connection may be provided between the conductive contact portions of the first and second Faraday cage portions.

30 Claims, 9 Drawing Sheets

U.S. PATENT DOCUMENTS

| | | |
|---|---|---|
| 4,530,029 A | 7/1985 | Beristain |
| 4,684,884 A | 8/1987 | Soderlund |
| 4,701,826 A | 10/1987 | Mikkor |
| 4,773,972 A | 9/1988 | Mikkor |
| 4,775,831 A | 10/1988 | Annamalai |
| 4,868,712 A | 9/1989 | Woodman |
| 4,870,224 A | 9/1989 | Smith et al. |
| 5,059,899 A | 10/1991 | Farnworth et al. |
| 5,315,486 A | 5/1994 | Fillion et al. |
| 5,381,039 A | 1/1995 | Morrison |
| 5,381,804 A | 1/1995 | Shambroom |
| 5,572,065 A | 11/1996 | Burns |
| 5,592,391 A | 1/1997 | Muyshondt et al. |
| 5,606,264 A | 2/1997 | Licari et al. |
| 5,682,065 A | 10/1997 | Farnworth et al. |
| 5,938,956 A | 8/1999 | Hembree et al. |
| 5,955,789 A | 9/1999 | Vendramin |
| 6,022,787 A | 2/2000 | Ma |
| 6,032,064 A | 2/2000 | Devlin et al. |
| 6,074,891 A | 6/2000 | Staller |
| 6,144,866 A | 11/2000 | Miesel et al. |
| 6,145,384 A | 11/2000 | Ikeda et al. |
| 6,171,252 B1 | 1/2001 | Roberts |
| 6,221,024 B1 | 4/2001 | Miesel |
| 6,278,379 B1 | 8/2001 | Allen et al. |
| 6,287,256 B1 | 9/2001 | Park et al. |
| 6,297,072 B1 | 10/2001 | Tilmans et al. |
| 6,297,551 B1 * | 10/2001 | Dudderar et al. ............. 257/723 |
| 6,298,255 B1 | 10/2001 | Cordero et al. |
| 6,303,977 B1 | 10/2001 | Schroen et al. |
| 6,323,550 B1 | 11/2001 | Martin et al. |
| 6,394,953 B1 | 5/2002 | Devlin et al. |
| 6,486,534 B1 | 11/2002 | Sridharan et al. |
| 6,500,694 B1 | 12/2002 | Enquist |
| 6,514,798 B2 | 2/2003 | Farnworth |
| 6,515,870 B1 * | 2/2003 | Skinner et al. ................ 361/800 |
| 6,516,808 B2 | 2/2003 | Schulman |
| 6,555,856 B1 | 4/2003 | Staller |
| 6,563,133 B1 | 5/2003 | Tong |
| 6,566,596 B1 | 5/2003 | Askew |
| 6,566,736 B1 | 5/2003 | Ogawa et al. |
| 6,638,784 B2 | 10/2003 | Bartlett et al. |
| 6,696,369 B2 | 2/2004 | Fraser et al. |
| 6,718,206 B2 | 4/2004 | Casavant |
| 6,774,327 B1 | 8/2004 | Wong |
| 6,821,342 B2 | 11/2004 | Mattes et al. |
| 6,822,326 B2 | 11/2004 | Enquist et al. |
| 6,855,115 B2 | 2/2005 | Fonseca et al. |
| 6,867,073 B1 | 3/2005 | Enquist |
| 6,874,367 B2 | 4/2005 | Jakobsen et al. |
| 6,902,987 B1 | 6/2005 | Tong et al. |
| 6,903,918 B1 | 6/2005 | Brennan |
| 6,962,835 B2 | 11/2005 | Tong et al. |
| 6,968,743 B2 | 11/2005 | Rich et al. |
| 7,041,178 B2 | 5/2006 | Tong et al. |
| 7,096,580 B2 | 8/2006 | Gonzalez et al. |
| 7,109,092 B2 | 9/2006 | Tong |
| 7,126,212 B2 | 10/2006 | Enquist et al. |
| 7,147,604 B1 | 12/2006 | Allen et al. |
| 7,150,195 B2 | 12/2006 | Jacobsen et al. |
| 7,162,926 B1 | 1/2007 | Guziak et al. |
| 7,205,181 B1 | 4/2007 | MacIntyre |
| 7,233,048 B2 | 6/2007 | Rybnicek |
| 7,238,999 B2 | 7/2007 | LaFond et al. |
| 7,247,517 B2 | 7/2007 | Rumer et al. |
| 7,305,889 B2 | 12/2007 | Fortin et al. |
| 7,318,264 B2 | 1/2008 | Schugt |
| 7,396,698 B2 | 7/2008 | Horning et al. |
| 7,403,818 B2 | 7/2008 | Kramer et al. |
| 7,462,552 B2 | 12/2008 | Tong et al. |
| 7,485,968 B2 | 2/2009 | Enquist et al. |
| 7,495,462 B2 | 2/2009 | Hua et al. |
| 7,540,188 B2 | 6/2009 | Wiese et al. |
| 7,563,692 B2 | 7/2009 | Fortin et al. |
| 7,622,324 B2 | 11/2009 | Enquist et al. |
| 7,647,836 B2 | 1/2010 | O'Brien et al. |
| 7,748,277 B2 | 7/2010 | O'Brien et al. |
| 7,759,774 B2 | 7/2010 | Fraser et al. |
| 7,781,250 B2 | 8/2010 | Wang et al. |
| 7,829,363 B2 | 11/2010 | You |
| 7,886,608 B2 | 2/2011 | Mothilal et al. |
| 7,902,851 B2 | 3/2011 | Fenner et al. |
| 2001/0033024 A1 * | 10/2001 | Fraser et al. ................... 257/758 |
| 2002/0115920 A1 | 8/2002 | Rich et al. |
| 2004/0186396 A1 | 9/2004 | Roy et al. |
| 2004/0222478 A1 | 11/2004 | Zhang et al. |
| 2005/0009246 A1 | 1/2005 | Enquist et al. |
| 2005/0065565 A1 | 3/2005 | Kramer et al. |
| 2006/0033204 A1 | 2/2006 | Fraser et al. |
| 2006/0264004 A1 | 11/2006 | Tong et al. |
| 2007/0037379 A1 | 2/2007 | Enquist et al. |
| 2007/0158769 A1 | 7/2007 | You |
| 2007/0179545 A1 | 8/2007 | Warkentin et al. |
| 2007/0199385 A1 | 8/2007 | O'Brien et al. |
| 2007/0251338 A1 * | 11/2007 | Wiese et al. ................. 73/866.1 |
| 2008/0027332 A1 | 1/2008 | Bradley |
| 2008/0312726 A1 | 12/2008 | Frank et al. |
| 2009/0270707 A1 | 10/2009 | Alfoqaha et al. |
| 2010/0314149 A1 | 12/2010 | Gerrish et al. |
| 2010/0314733 A1 | 12/2010 | Mueller et al. |
| 2010/0315110 A1 | 12/2010 | Fenner et al. |
| 2010/0324614 A1 | 12/2010 | Mueller et al. |

OTHER PUBLICATIONS

U.S. Appl. No. 13/302,725, filed Nov. 22, 2011, Mueller et al.
Lau, "MEMS Structures for Stress Measurements for Thin Films Deposited Using CVD," Master of Science Thesis, Massachusetts Institute of Technology, Feb. 2001, 79 pgs.
Oberg et al., Machinery's Handbook, $25^{th}$ edition, Industrial Press, New York, NY, 1996; title page, copyright page and p. 267. 2 pages total.
Osterberg et al., "M-TEST: A Test Chip for MEMS Using Electrostatically Actuated Test Structures" *Journal of Microelectromechanical Systems*, Jun. 1997; 6(2): 107-118.
Potkay, Joseph A., "Long term, implantable blood pressure monitoring systems," *Biomed. Microdevices*, 2008; 10:379-392; published online Dec. 20, 2007.
U.S. Appl. No. 12/569,431, filed Sep. 29, 2009, Gerrish et al.
U.S. Appl. No. 12/569,474, filed Sep. 29, 2009, Fenner et al.
U.S. Appl. No. 12/569,504, filed Sep. 29, 2009, Mueller et al.
Lea et al., "DRIE from MEMS to wafer-level packaging," *Solid State Technology*, Dec. 2007; 50(12), 8 pgs. Retrieved online on Oct. 11, 2010. Available online at <url:http://www.electroiq.com/ElectroIQ/en-us/index/display/Semiconductor_Article_Tools_Template.articles.solid-state-technology.volume-50.issue-12.features.mems.drie-from-mems-to-wafer-level-packaging.html>.
Pham et al., "High-aspect-ratio bulk micromachined vias contacts," ProcSAFE & Prorisc 2004, Veldhoven, NL, Nov. 25-26, 2004, pp. 742-746.

* cited by examiner

FARADAY CAGE FOR CIRCUITRY USING SUBSTRATES

CROSS-REFERENCE TO RELATED APPLICATIONS

This application claims the benefit of U.S. Provisional Application Ser. No. 61/185,881 filed 10 Jun. 2009, entitled "FARADAY CAGE FOR CIRCUITRY USING SUBSTRATES," U.S. Provisional Application Ser. No. 61/229,867 filed 30 Jul. 2009, entitled "APPARATUS FOR RESTRICTING MOISTURE INGRESS," U.S. Provisional Application Ser. No. 61/229,869 filed 30 Jul. 2009, entitled "HERMETICITY TESTING," and U.S. Provisional Application Ser. No. 61/235,745 filed 21 Aug. 2009, entitled "HERMETICALLY-SEALED ELECTRICAL CIRCUIT APPARATUS," all of which are incorporated herein by reference in their respective entireties.

BACKGROUND

The disclosure herein relates generally to Faraday cage enclosures for shielding circuitry from electromagnetic interference (EMI), and further to fabrication methods for constructing such enclosures.

Electrical circuits (e.g., integrated circuits) include many types of active and passive devices (e.g., transistors, capacitors, resistors, etc.) that may be subject to EMI. For example, interference may affect the operation and performance of circuitry, such as sensitive circuits used in implantable medical devices (e.g., sensor circuitry, pacing circuitry, timing circuitry, etc.). One way to mitigate such interference issues is to place such circuits in a Faraday cage.

SUMMARY

The disclosure herein relates generally to apparatus that provides a Faraday cage for circuitry, and methods for providing apparatus including such Faraday cages. For example, as described in one or more embodiments herein, semiconductor substrates and semiconductor fabrication techniques may be used to provide a Faraday cage for a circuit device (e.g., a die that includes EMI sensitive circuitry).

One exemplary apparatus disclosed herein includes at least one circuit device including electrical circuitry, a first Faraday cage portion, and a second Faraday cage portion. For example, the first Faraday cage portion may include a first conductive portion of a Faraday cage enclosure surrounding the at least one circuit device. The second Faraday cage portion, for example, may include a second conductive portion of the Faraday cage enclosure surrounding the at least one circuit device. A connection surface of the first Faraday cage portion may be aligned and bonded (e.g., oxide bonded) to a connection surface of the second Faraday cage portion such that an electrical connection is provided between the first conductive portion of the first Faraday cage portion and the second conductive portion of the second Faraday cage portion to form the Faraday cage enclosure. In one embodiment of the apparatus, a cavity may be defined in a connection surface of at least one of the first and second Faraday cage portions (e.g., the cavity being sized to receive the circuit device).

One exemplary method of providing a Faraday cage enclosure for surrounding at least one circuit device may include providing a first Faraday cage portion including a first conductive portion of a Faraday cage enclosure and providing a second Faraday cage portion including a second conductive portion of the Faraday cage enclosure. The method may further include aligning the first Faraday cage portion with the second Faraday cage portion. A connection surface of the first Faraday cage portion may be bonded to a connection surface of the second Faraday cage portion so as to provide electrical connection between the first conductive portion of the first Faraday cage portion and the second conductive portion of the second Faraday cage portion to form the Faraday cage enclosure. In one embodiment of the method, the circuit device may be positioned in a cavity defined in a connection surface of at least one of the first and second Faraday cage portions (e.g., wherein the cavity is sized to receive the circuit device).

The above summary of the present invention is not intended to describe each embodiment or every implementation of the present invention. Advantages, together with a more complete understanding of the invention, will become apparent and appreciated by referring to the following detailed description and claims taken in conjunction with the accompanying drawings.

Figure 1A:
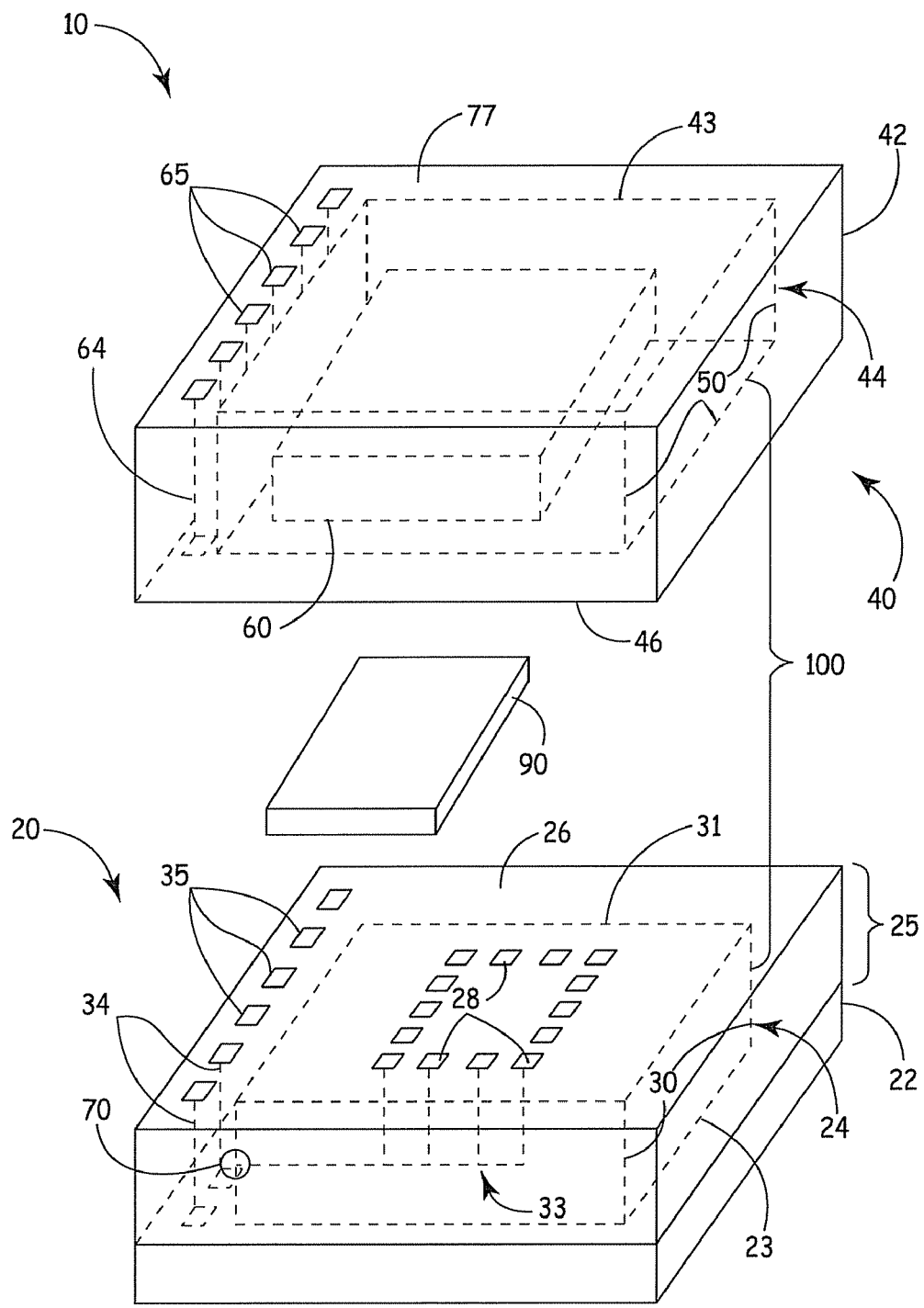
FIGS. 1A and 1B are generalized illustrative exploded perspective and side views, respectively, of one exemplary embodiment of an apparatus including a Faraday cage about circuitry.

The figures are rendered primarily for clarity and, as a result, are not necessarily drawn to scale.

DETAILED DESCRIPTION OF EXEMPLARY EMBODIMENTS

In the following detailed description of illustrative embodiments, reference is made to the accompanying figures of the drawing which form a part hereof, and in which are shown, by way of illustration, specific embodiments which may be practiced. It is to be understood that other embodiments may be utilized and structural changes may be made without departing from (e.g., still falling within) the scope of the disclosure presented hereby.

Exemplary apparatus, and methods of constructing such apparatus, shall be described with reference to FIGS. 1-6. It will be apparent to one skilled in the art that elements from one embodiment may be used in combination with elements of the other embodiments, and that the possible embodiments of such apparatus using combinations of features set forth herein is not limited to the specific embodiments shown in the Figures and/or described herein. Further, it will be recognized that the embodiments described herein may include many elements that are not necessarily shown to scale. Further, it will be recognized that the size and shape of various elements herein may be modified but still fall within the scope of the present disclosure, although one or more shapes and/or sizes, or types of elements, may be advantageous over others.

Figure 1B:
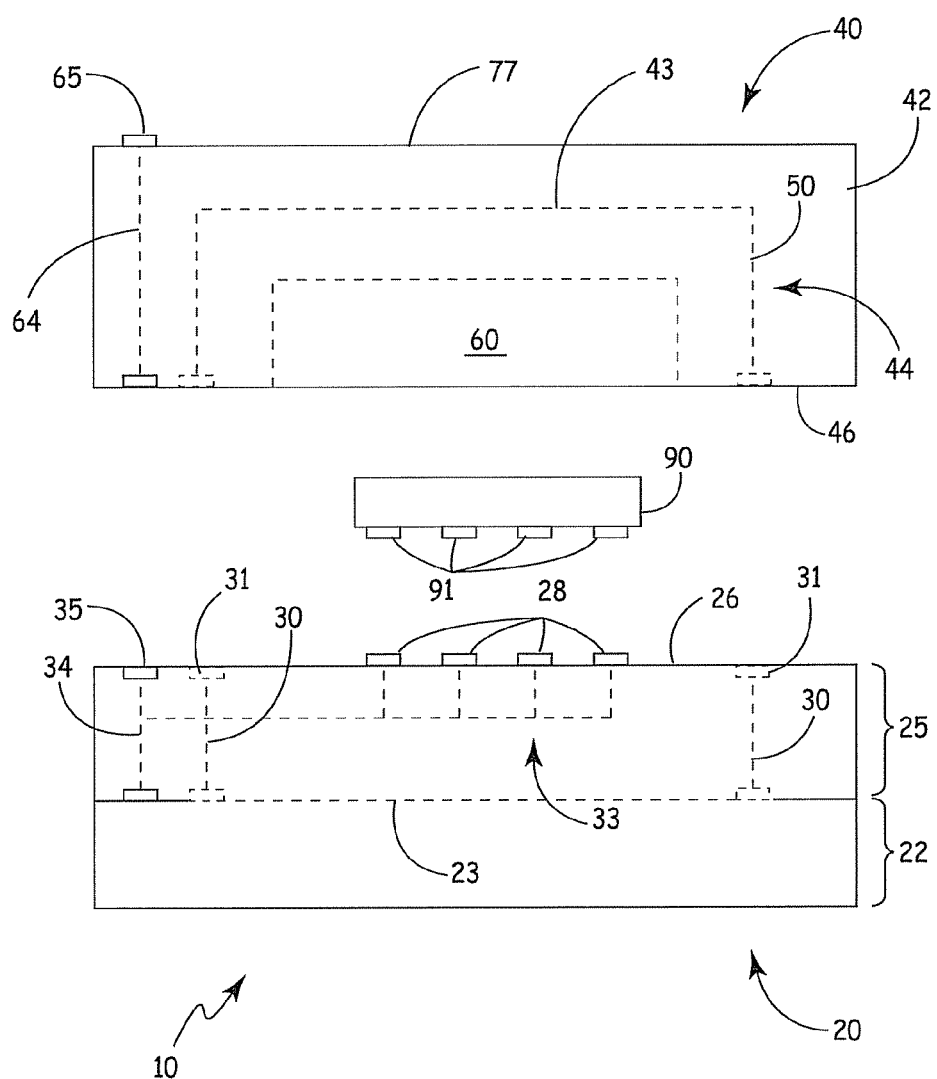
Figure 4:
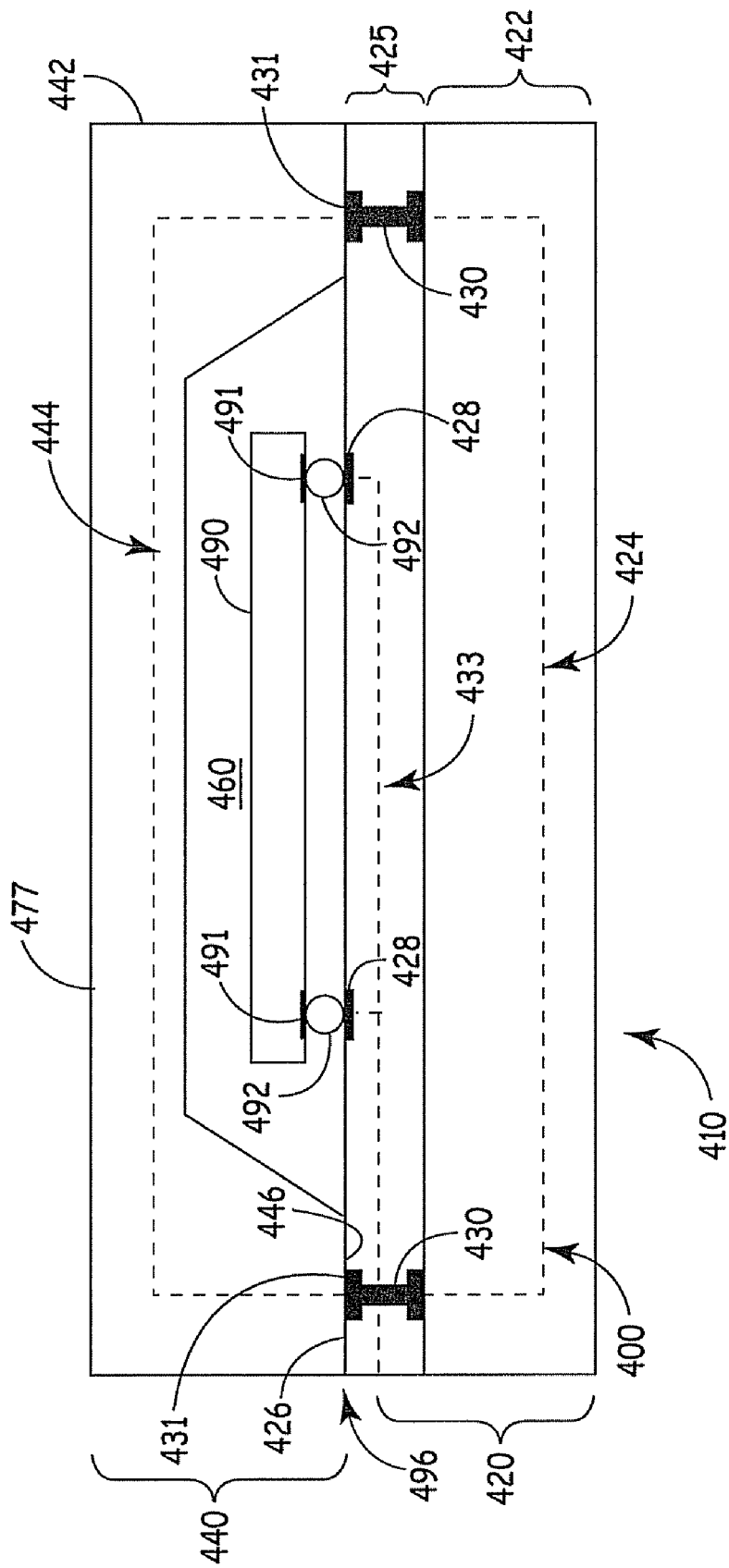
FIG. 4 is an illustrative cross-sectional side view of another exemplary embodiment of an apparatus such as generally shown in FIG. 1.

FIGS. 1A-1B show generalized exploded perspective and side views of components which may fault a part of an exemplary apparatus 10 that when assembled includes a Faraday cage enclosure 100 surrounding circuit device 90. The Faraday cage enclosure mitigates the effects of EMI on the operation and/or performance of the circuit device 90. The Faraday cage enclosure 100 may take any shape or size suitable for its intended purpose. For example, the enclosure may be rectangular in shape (e.g., with a top, bottom, and one or more side walls), cylindrical in shape (e.g., with a top, bottom, and circular side wall), etc. Further, for example, the shape of the enclosure 100 may not be describable by a particular shape (e.g., in the case where, for example, the doped semiconductor substrate itself forms the entire upper portion of the enclosure such as shown in FIG. 4). One or more of such enclosures or shapes thereof may be more easily constructed than others.

The circuit device 90 may be any device that includes electrical circuitry that performs one or more functions. In one or more embodiments, the circuit device 90 includes at least a plurality of device contacts 91. For example, as shown in FIG. 1B, the circuit device (e.g., a device that is positioned in a cavity defined in second Faraday cage portion 40) may include a plurality of device contacts 91 configured in a particular arrangement at a lower surface of the circuit device 90. However, such device contacts 91 may be arranged in any configuration and be located in any suitable location for connection of the device contacts 91 to other conductive elements. For example, such device contacts 91 may include die bond pads of a die that contains circuitry, or such device contacts 91 may be contacts of a packaged device such as a ball grid array package, a land grid array package, etc. Further, for example, the device contacts may include, or be connected to other conductive elements using, solder material such as a solder ball or bump. In one or more other embodiments, the circuit device may be formed as part of one or more layers of the structures forming the Faraday cage enclosure (e.g., the circuit device may be provided as part of the one or more layers 25 of the first Faraday cage portion 20, such as being formed at the same time as other portions thereof).

The Faraday cage enclosure 100 provided by the apparatus 10 may be used to mitigate the effects of EMI on circuitry of various types (e.g., passive or active devices used to perform a desired function). Although not limited thereto, in one or more embodiments, the apparatus 10 is beneficial for mitigating the effects of EMI on circuitry used in implantable medical devices. For example, the apparatus 10 including the Faraday cage enclosure 100 surrounding the circuit device 90 may be a part of an implantable medical device.

For example, the implantable medical device may be a device implantable in a body near a human heart. For example, the implanted medical device may be any implantable cardiac pacemaker, defibrillator, cardioverter-defibrillator, or pacemaker-cardioverter-defibrillator (PCD). Further, for example, the implantable medical device 12 may be an implantable nerve stimulator or muscle stimulator, an implantable monitoring device (e.g., a hemodynamic monitoring device), a brain stimulator, a gastric stimulator, a drug pump, or any other implantable device that would benefit from the protection from EMI. Therefore, the apparatus 10 may find wide application in any form of implantable medical device. As such, any description herein making reference to any particular medical device is not to be taken as a limitation of the type of medical device which can benefit from and which can employ the EMI protection as described herein.

Further, although the EMI protection may be beneficial for implantable medical devices, such protection is no manner limited to such applications. For example, such protection may be beneficial for many different types of circuitry (e.g., whether for medical use or not, whether for an implantable medical device or not). For example, one or more types of circuits that may benefit from such EMI protection may include circuits such as sensor circuits, pacing circuits, timing circuits, telemetry circuits, etc.

Figure 2:
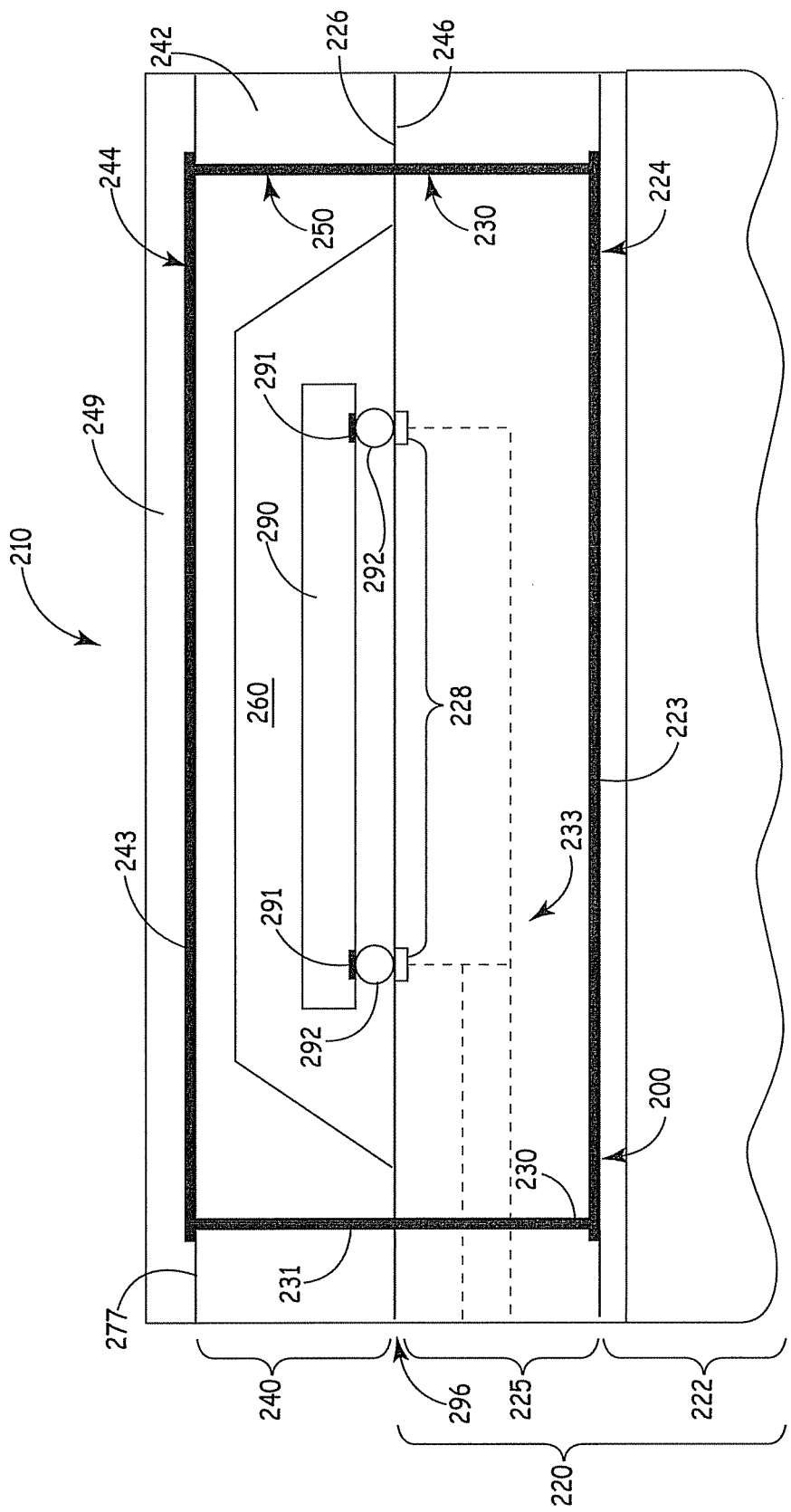
FIG. 2 is an illustrative cross-sectional side view of one exemplary embodiment of an apparatus such as generally shown in FIG. 1.

The apparatus 10, as shown generally in the exploded views of FIGS. 1A and 1B, includes a first Faraday cage portion 20 and a second Faraday cage portion 40. The first Faraday cage portion 20 includes a first conductive portion 24 and the second Faraday cage portion 40 includes a second conductive portion 44. When assembled and/or bonded together, the first and second Faraday cage portions 20, 40 provide the Faraday cage enclosure 100 surrounding the at least one circuit device 90. In other words, at least in one embodiment, the first conductive portion and the second conductive portion are in electrical connection so as to provide the Faraday cage enclosure 100 (e.g., such as the Faraday cage enclosure 200 as shown in FIG. 2 or the Faraday cage enclosure 400 as shown in FIG. 4).

Wafer scale fabrication techniques may be used to form each of the first and second Faraday cage portions 20, 40. Generally, in one or more embodiments, each of the first Faraday cage portion 20 and the second Faraday cage portion 40 include a substrate provided from or as a part of a wafer (e.g., a portion of any size and shape of substrate usable in wafer scale fabrication processes, such as a circular silicon wafer, a glass substrate, etc.). In other words, multiple cage portions may be fabricated on a wafer (e.g., the first Faraday cage portions on a first wafer and the second Faraday cage portions on a second wafer). As such, the fabrication of each of the Faraday cage portions may be initiated with use of a wafer substrate (e.g., a semiconductor substrate wafer). In one or more embodiments, the wafer substrate is a doped semiconductor wafer substrate (e.g., doped to either a bulk n-type or p-type wafer), such as those used as the base substrate for microelectronic devices (e.g., substrates built in and over using one or more microfabrication process steps such as doping, ion implantation, etching, deposition of various materials, and photolithographic patterning processes). In one or more embodiments, the semiconductor wafer is a silicon wafer. However, other available types of semiconductor wafers may be used, such as, for example, a gallium arsenide wafer, a germanium wafer, a silicon on insulator (SOI) wafer, etc. Further, for example, in one or more embodiments, the substrate may be formed of one or more materials other than semiconductor material, such as a glass substrate, wherein the substrate includes a metal film. In other words, for example, the first Faraday cage portion 20 may include a substrate 22 provided from or as a part of a wafer. Further, for example, the second Faraday cage portion 40 may include a substrate 42 provided from or as a part of a wafer.

In one or more embodiments, the first Faraday cage portion 20 may include at least one patterned metal layer formed on the substrate 22 providing a part of the first conductive portion 24 of the Faraday cage enclosure 100 (e.g., may provide the bottom of the enclosure 100). For example, as shown in FIGS. 1A-1B, the first Faraday cage portion 20 includes a metal layer represented generally by dashed line 23 formed on the substrate 22 (e.g., providing a bottom of a faraday cage enclosure 100). However, in one or more other embodiments, as described herein, a conductive substrate, such as a doped semiconductor substrate, may itself function as a portion of the Faraday cage enclosure 100 as is also represented generally by line 23.

Further, in one or more embodiments, the first Faraday cage portion 20 may include one or more layers 25 formed over the substrate 22 (e.g., over a patterned metal layer that provides the bottom of the Faraday cage enclosure or directly on a conductive semiconductor substrate) terminating at a connection surface 26 (e.g., a connection surface that may include one or more conductive contact pads 28 for connection with the one or more device contacts 91 of circuit device 90. In one or more embodiments, the one or more layers 25 provide an electrical interconnect 33 extending from one or more of the conductive contact pads 28 provided for connection to the one or more device contacts 91 to a location outside of the Faraday cage enclosure 100. For example, the one or more layers 25 may provide a multilayer interconnect to the location outside of Faraday cage enclosure 100. In one or more other embodiments, the one or more layers 25 may also provide the circuit device that is to be connected to a location outside of the Faraday cage enclosure 100 by the electrical interconnect 33 (e.g., the circuit device would not be provided separately for positioning on the connection surface 26).

Still further, in one or more embodiments, the apparatus 10 (e.g., the first Faraday cage portion 20 and/or the second Faraday cage portion 40) may not include interconnects or vias connecting the circuit device 90 to contact pads outside of the Faraday cage enclosure 100 and/or apparatus 10. For example, in at least one embodiment, the apparatus 10 may include various apparatus and/or structures to wirelessly communicate to other devices/apparatus outside of the Faraday cage enclosure 100 and/or apparatus 10.

At least in one embodiment, connection surface 26 defined at least partly by the one or more layers 25 may include oxide material (e.g., in surface regions apart from one or more conductive portions of the connection surface 26, such as the one or more via contacts 31, interconnect conductive pads 35, etc.). For example, such oxide material may be oxide material formed, deposited or grown as part of one or more processing steps (e.g., oxides such as BPSG, silicon oxide, native oxide, etc.).

In one or more embodiments, a plurality of conductive vias represented generally by reference numeral 30 are formed in the one or more layers 25 to provide another part of the first conductive portion 24 of the Faraday cage enclosure 100 (e.g., to provide at least portions of one or more side walls of the Faraday cage enclosure). Each of the plurality of conductive vias 30 are in electrical contact with the bottom part of the Faraday cage enclosure (e.g., in contact with the patterned metal layer formed on the substrate in one or more embodiments, or in contact with the conductive substrate in other embodiments). Further, the plurality of conductive vias 30 terminate in via contacts 31 at the connection surface 26 of the first Faraday cage portion 20.

Further, for example, in one or more embodiments, the first Faraday cage portion 20 includes one or more interconnect vias 34 outside of the Faraday cage enclosure 100. The one or more interconnect vias 34, for example, terminate with one or more conductive pads 35 at the connection surface 26 (e.g., for use in providing accessible surface contacts, such as surface contacts 65 at a surface of at least one of the first and second Faraday cage portions 20, 40). In one or more embodiments, the electrical interconnect 33 passes through one or more insulated locations 70 of the Faraday cage enclosure 100 to connect to the one or more interconnect vias 34.

The formation of the interconnect 33, the conductive vias 30, interconnect vias 34, and one or more of the various conductive pads or contacts of the first Faraday cage 20 (as well as those of the second Faraday cage 40) may be formed using standard microelectronic fabrication processing techniques (e.g., such as etching of materials, deposition of materials, and photolithographic patterning process steps, etc.). Various portions of first and second Faraday cages 20, 40 may be formed during the same or different processing steps. For example, a portion of a stacked via that may be used to provided a portion of an interconnect via 34 may be formed with an interconnect layer within the Faraday cage enclosure 100 used to provide a portion of the interconnect 33. Further, for example, portions of a circuit device may be formed with the stacked via and/or with an interconnect layer within the Faraday cage enclosure 100 used to provide a portion of the interconnect 33. Still further, for example, process steps to form the vias may be completely separate therefrom, such as in the formation of a through silicon via after other layer processing is completed. The present disclosure is not limited to any particular processing, or timing or order, of such process steps. However, some types of processing and order thereof may be beneficial over other types.

The one or more vias described herein may be constructed in one or more suitable forms for providing the functionality thereof in accordance to the disclosure provided herein. For example, the interconnect vias 34 of the first Faraday cage portion 20 may be formed as stacked interconnect vias formed as the one or more layers 25 are constructed. Further, for example, other vias described herein may be formed as through silicon vias. For example, as described further herein, in one or more embodiments, the interconnect vias 64 of the second Faraday cage enclosure 40 or the conductive vias 50 thereof may be advantageously formed using through silicon vias. Further, other types of vias, such as trench vias or the like, may be used.

The plurality of conductive vias, such as vias 30 of the first Faraday cage portion 20 or vias 50 of the second Faraday cage portion 40, may be provided in one or more configurations suitable for reducing EMI. For example, any configuration suitable for shielding the interior of the cage enclosure 100 from external electromagnetic radiation may be used (e.g., the conductive portions 24 and 44 are thick enough and any holes in the enclosure are significantly smaller than the radiation's wavelength). One or more different via configurations are shown and described with reference to FIGS. 6A-6B. However, the present disclosure is not limited thereto as various configurations of conductive vias may be used to provide the conductive functionality of such vias in the formation of the Faraday cage enclosure 100.

Figure 6A:
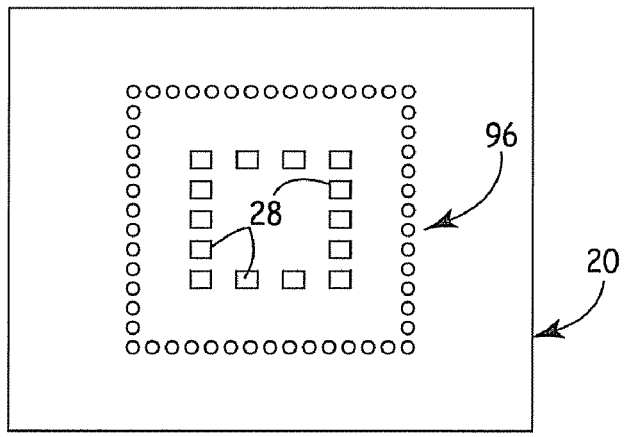
FIGS. 6A-6C illustrate various via configurations that may be used to form the Faraday cage shown generally in FIG. 1.
Figure 6B:
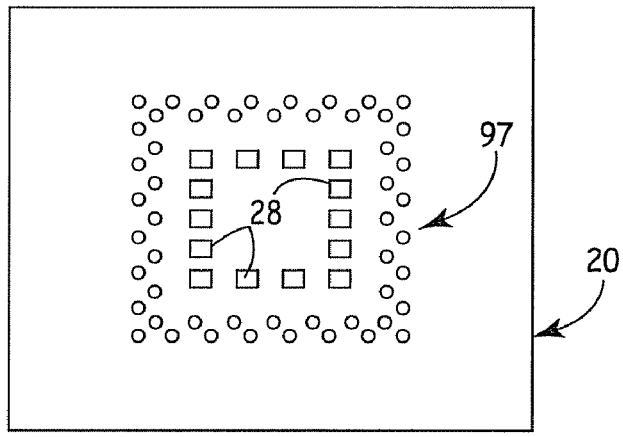
Figure 6C:
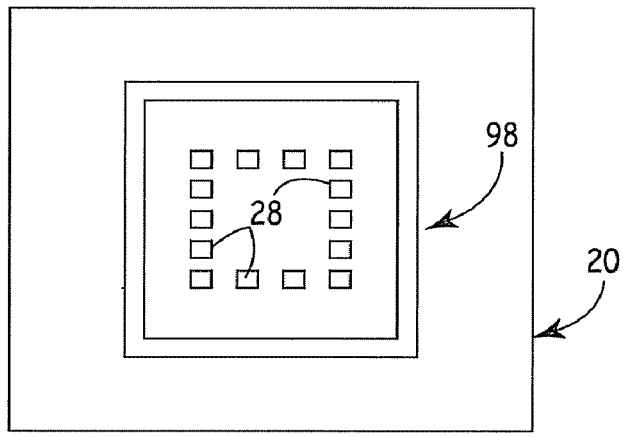

For example, in one or more embodiments, conductive vias 96 may be fowled in a side by side configuration (e.g., one or more rows of vias) to form the perimeter of the Faraday cage enclosure (e.g., the side walls or portion thereof) as shown in FIG. 6A. The spacing between such side by side vias in the configuration shown in FIG. 6A would be smaller than the wavelength of the radiation to be prevented from affecting the circuit device's performance. Further, for example, in one or more embodiments, the vias may be formed in multiple rows of side by side vias 97 to form the perimeter of the Faraday cage enclosure as shown in FIG. 6B. The vias of such rows are offset from one another such that the spacing between vias in the rows need not be as close together to effectively block radiation. Still further, for example, in one or more embodiments, the plurality of vias may be provided by one or more trenches 98 (e.g., trench vias) formed about the perimeter of the Faraday cage enclosure (e.g., as the side wall of the enclosure) as shown in FIG. 6C. In other words, as used herein, a plurality of conductive vias refers to any type of via, including trenches formed to perform the same functionality.

In one or more embodiments, the conductive materials used to form the Faraday cage enclosure may be any suitable material effective for use in mitigating the effects of EMI on the circuit device 90. For example, in one or more embodiments, conductive materials such as one or more metals (e.g., aluminum, copper, etc.) may be used for forming the top and bottom portions of the Faraday cage enclosure 100. Further, for example, in one or more embodiments, the conductive vias may be lined and/or filled with conductive materials including, for example, one or more metals (e.g., tungsten, titanium, copper, etc.).

In one or more embodiments, the second Faraday cage portion 40 provides the second conductive portion 44 of the Faraday cage enclosure 100 surrounding the at least one circuit device 90. For example, in one or more embodiments, the second Faraday cage portion 40 includes the substrate 42 provided from or as a part of a wafer. In one or more embodiments, a conductive semiconductor substrate 42 itself provides the second conductive portion 44 (see FIG. 4), while in one or more other embodiments, one or more other features are provided (e.g., conductive vias and metallization layers such as shown in FIG. 2) to provide parts of the conductive portion 44 of the Faraday cage enclosure 100.

For example, in one or more embodiments, a plurality of conductive vias (shown generally by lines 50) are formed in the substrate 42 corresponding to the plurality of conductive vias 30 of the first Faraday cage portion 20. The plurality of conductive vias 50 provide a part of the second conductive portion 44 of the Faraday cage enclosure 100 (e.g., such as forming the side walls of the Faraday enclosure 100). For example, each of the plurality of conductive vias 50 of the second Faraday cage portion 100 may extend between a connection surface 46 of the substrate 42 and a surface 77 of the substrate opposite the connection surface 46.

At least in one embodiment, to form the remainder of the conductive portion 44 when conductive vias 50 are used to form a part of the Faraday cage enclosure 100, at least one patterned metal layer (represented generally by reference numeral 43) may be formed on the surface 77 of the substrate 42 opposite the connection surface 46 and in electrical contact with the plurality of conductive vias 50 of the second Faraday cage 40 (e.g., forming a top portion of the Faraday enclosure 100). However, in one or more other embodiments, the substrate itself (e.g., a doped conductive semiconductor substrate from or part of a semiconductor wafer) provides the conductive portion 44 of the second Faraday cage portion 40 (e.g., both the side walls represented generally by reference numeral 50 and the top of the Faraday enclosure 100 as represented generally by reference numeral 43).

At least in one embodiment, connection surface 46 may include oxide material (e.g., in surface regions apart from one or more conductive portions of the connection surface 46, such as the one or more vias 50, interconnect conductive vias 34, etc.). For example, such oxide material may be oxide material deposited or grown as part of one or more processing steps (e.g., oxides such as BPSG, silicon oxide, native oxide, etc.).

In one or more embodiments, the second Faraday cage portion 40 includes the one or more interconnect vias 64 extending therein from connection surface 46 and terminating at one or more surface contacts 65 at surface 77 of the second Faraday cage portion 40. Such interconnect vias 64 may correspond to, and be alignable with, the interconnect vias 34 so as to provide electrical connection from the one or more of the conductive contact pads 28 connected to the one or more device contacts 91 to the surface contacts 65 at an outer portion of the apparatus 10. Surface contacts 65 may be located at any outer surface of the apparatus 10 with appropriate connection routing. However, some locations may be more beneficial than others. The surface contacts are configured for connection to one or more other conductive components, such as, without limitation, pads on a target board, lead conductors, etc.

In one or more embodiments where vias are formed in the substrate, such vias may be formed as through vias (e.g., such as through silicon vias formed in a silicon substrate) extending through the substrate (and even one or more layers formed thereon). For example, the interconnect vias 64 may be constructed using through via techniques (e.g., through silicon via techniques), as well as the other conductive vias (represented generally by reference numeral 50). For example, in one or more embodiments, without limitation, the vias may be formed by defining a hole (e.g., using a dry or wet etch) through a silicon substrate (e.g., may be etched through overlying layers of metal and dielectric formed thereon or therein using deep reactive ion etching process). Further, such holes may be formed by laser drilling or sand blasting. The hole may be lined with a dielectric (e.g., native oxide formation, the growing of oxide material (e.g., silicon oxide), or deposition of a dielectric material), and thereafter filled or lined with one or more conductive materials.

In one or more embodiments, a cavity 60 may be defined in the connection surface 26, 46 of at least one of the first and second Faraday cage portions 20, 40 (e.g., the cavity may be defined in either one of the surfaces or a portion of the cavity defined in both). The cavity 60 is surrounded by the Faraday cage enclosure 100 (e.g., by the first conductive portion and the second conductive portion when the cage portions 20, 40 are, for example, bonded together). In one or more embodiments, the cavity 60 is defined in the connection surface 46 (e.g., to a depth within the substrate) of the second Faraday cage portion 40 and is sized to receive the circuit device 90 for connection of the one or more device contacts 91 thereof to the one or more of conductive contact pads 28 of the first Faraday cage portion 20. In one or more other embodiments, a cavity need not be defined. For example, one or more circuit devices may be formed as part of the first and/or second Faraday cage portions 20, 40 (e.g., one or more circuit devices may be formed in one or more layers of one of the cage portions, formed in each cage portion with the devices being separately connected to a location outside of the Faraday cage enclosure, formed in each cage portion with the devices being electrically connected to one another via conductive pads such as at the connection surfaces of the cage portions, or formed in one or more of cage portions and electrically connected in any other suitable manner).

To form the apparatus 10, the first Faraday cage portion 20 and the second Faraday cage portion 40 are coupled together (e.g., the circuit device 90 positioned in the cavity 60 is surrounded by the Faraday cage enclosure 100 formed by the Faraday cage portions 20 and 40; the enclosure 100 formed by the first conductive portion 24 and the second conductive portion 44 being electrically coupled). For example, in one or more embodiments, the connection surfaces 26, 46 of first Faraday cage portion 20 and the second Faraday cage portion 40 may be bonded together to assemble the apparatus 10. In such a manner, in one or more embodiments, the plurality of conductive vias 30 of the first Faraday cage portion 20 and the plurality of conductive vias 50 of the second Faraday cage portion 40 are electrically connected when the connection surface 26 of the first Faraday cage portion 20 is bonded to the connection surface 46 of the second Faraday cage portion 40;

thus, completing the formation of the Faraday cage enclosure 100. Further, for example, in such a manner, in one or more embodiments, the plurality of interconnect vias 34 of the first Faraday cage portion 20 and the plurality of interconnect vias 64 of the second Faraday cage portion 40 are electrically connected when the connection surface 26 of the first Faraday cage portion 20 is bonded to the connection surface 46 of the second Faraday cage portion 40; thus, for example, in one or more embodiments forming a connection of the device contacts 91 of the circuit device 90 to the surface contacts 65.

In other alternate embodiments, for example, where a conductive semiconductor substrate 42 provides the second conductive portion 44 of the Faraday cage enclosure (e.g., as opposed to vias and metallization layers), bonding the first and second Faraday cage portions 20, 40 together to assemble the apparatus 10, may result in the plurality of conductive vias 30 of the first Faraday cage portion 20 being electrically connected with conductive portions of the conductive semiconductor surface 46 of the second Faraday cage portion 40 to provide the Faraday cage enclosure 100.

In one or more embodiments, bonding the first and second Faraday cage portions 20, 40 together to assemble the apparatus 10 may be implemented using any wafer bonding process (e.g., bonding a wafer including the first Faraday cage portions with a wafer including the second Faraday cage portions, which also refers to the bonding of individual die to full wafers), such as chemical bonding processes (e.g., those using adhesion promoters), high temperature bonding processes, hydrogen bonding processes, and oxide bonding processes. For example, use of oxide bonding permits oxide surfaces (e.g., portions of the connection surfaces 26, 46 of the first and second Faraday cage portions 20, 40 including an oxide material, such as silicon oxide) to be bonded together. Further, for example, in one or more embodiments, the connection surfaces may be chemical mechanically polished or planarized to expose any conductive portions thereof (e.g., the via contacts 31 at connection surface 26, or conductive pads 35 at connection surface 26) to be exposed. For example, when the oxide portions and the conductive portions at the connection surface 26 (e.g., a planar surface) are aligned with the oxide portions and the conductive portions of the connection surface 46 (e.g., a planar surface), oxide bonding may be performed. For example, oxide bonding processes may form a bond between oxide portions of the connection surfaces 26, 46 of the first and second Faraday cage portions 20, 40 without the need for adhesives or other intermediate layers may be used.

FIG. 2 is a schematic cross-sectional side view of one exemplary embodiment of an apparatus 210 providing a Faraday cage enclosure 200 about at least one circuit device 290. The apparatus 210 includes at least one circuit device 290 (e.g., one or more circuits that include electrical circuitry). The circuit device 290 may include one or more device contacts 291 that may be connected to other conductive pads, such as conductive pads 228, for example, with solder material, such as solder balls 292.

The apparatus 210 further includes a first Faraday cage portion 220 that provides a first conductive portion 224 and a second Faraday cage portion 240 that provides a second conductive portion 244 of the Faraday cage enclosure 200 surrounding the at least one circuit device 290. The first Faraday cage portion 220 includes a substrate 222 provided from or as a part of wafer (e.g., a doped or an undoped silicon wafer, or an insulating wafer such as glass or plastic).

Further, as shown in the exemplary schematic embodiment of FIG. 2, the first Faraday cage portion 220 includes at least one patterned metal layer 223 foamed on the substrate 222 which provides a part of the first conductive portion 224 (e.g., the bottom portion) of the Faraday cage enclosure 200. Still further, at least in one embodiment, the first Faraday cage portion 220 includes one or more additional layers 225 formed on the at least one patterned metal layer 223 terminating at a connection surface 226 that includes one or more conductive contact pads 228 connected to the one or more device contacts 291 (e.g., through a solder connection).

The one or more additional layers 225 may include any number of layers desired for providing an electrical interconnect (schematically shown by dashed lines 233) extending from one or more of the conductive contact pads 228 to a location outside of the Faraday cage enclosure 200. For example, at least in one embodiment, the electrical interconnect is a multilayer interconnect for providing interconnection of the pads 228 (and thus device 290) outside of the Faraday cage enclosure 200. Further, in at least one embodiment, the electrical interconnect 233 extends from one or more of the conductive contact pads 228 to a location outside of the Faraday cage enclosure 200 by passing through one or more insulated locations of the Faraday cage enclosure 200 (e.g., locations small enough to still maintain protection from EMI). The electrical interconnect 233 can be terminated at a surface of the apparatus 210 (e.g., by surface contacts as described with reference to FIGS. 1A-1B) in any number of manners (e.g., using one or more vias or additional interconnect structure).

The first Faraday cage portion 220 may further include a plurality of conductive vias 230 formed in the one or more additional layers 225 to provide a part of the first conductive portion 220 of the Faraday cage enclosure 200. Each of the plurality of conductive vias 230 are in contact (e.g., ohmic contact) with the at least one patterned metal layer 223 and terminate in a via contact 231 at the connection surface 226 of the first Faraday cage portion 220.

The second Faraday cage portion 240 of the apparatus 110 provides the second conductive portion 244 of the Faraday cage enclosure 200. The second Faraday cage portion includes a substrate 242 provided from or as a part of wafer (e.g., a doped or an undoped silicon wafer, or an insulating wafer such as glass or plastic).

Further, as shown in the exemplary embodiment of FIG. 2, the second Faraday cage portion 240 includes a plurality of conductive vias 250 (e.g., a plurality of through silicon vias extending through a semiconductor substrate) formed in the substrate 242 and corresponding to the plurality of conductive vias 230 of the first Faraday cage portion 220. The plurality of conductive vias 250 provide a part (e.g., the sidewalls) of the second conductive portion 244 of the Faraday cage enclosure 200. In at least one embodiment, each of the plurality of conductive vias 250 of the second Faraday cage portion 240 extend between a connection surface 246 of the substrate 242 and a surface 277 of the substrate 242 opposite the connection surface 246 (e.g., the surfaces 246 and 277 being opposite sides of a silicon semiconductor wafer or a portion thereof).

As shown in FIG. 2, a cavity 260 is defined in the connection surface 246 of the second Faraday cage portion 240 (e.g., wet or dry etched therein). The cavity 260 is sized to receive the at least one circuit device 290 for connection to the one or more of conductive contact pads 228 of the first Faraday cage portion 200.

At least one patterned metal layer 243 is formed on the surface 277 of the substrate 242 and in electrical contact with the plurality of conductive vias 250 of the second Faraday cage portion 240 to provide a part of the second conductive portion 244 of the Faraday cage enclosure (e.g., a top portion of the enclosure). Further, an insulative layer 249 may be formed on at least a portion of the at least one patterned metal layer 243.

As shown in the exemplary embodiment of FIG. 2, the plurality of conductive vias 230 of the first Faraday cage portion 220 and the plurality of conductive vias 250 of the second Faraday cage portion 240 are in electrical connection at the interface 296 between the first and second Faraday cage portions 220, 240. For example, when the connection surface 226 of the first Faraday cage portion 220 is bonded to the connection surface 246 of the second Faraday cage portion 240, the Faraday cage enclosure 200 is formed by the electrically connected first conductive portion 224 and second conductive portion 244.

The interface 296 between the connection surfaces 226, 246 of the first and second Faraday cage portions 220, 240 may include bonded oxide portions in locations other than where conductive elements are being electrically connected (e.g., such as conductive vias or contacts being connected to form the Faraday cage enclosure 200). For example, such bonded oxide portions may be formed if an oxide bonding process is used to couple the Faraday cage portions.

FIGS. 3A-3G are diagrams generally illustrating a process flow (e.g., a wafer scale process flow) for constructing one exemplary embodiment of an apparatus 310 (see FIG. 3G) such as, for example, generally shown in FIG. 1. The method provides a Faraday cage enclosure 300 for surrounding at least one circuit device 390 (e.g., the circuit device 390 may include one or more device contacts 391 that may be connected to other conductive pads, such as conductive pads 328, for example, with solder material, such as solder balls 392).

Figure 3A:
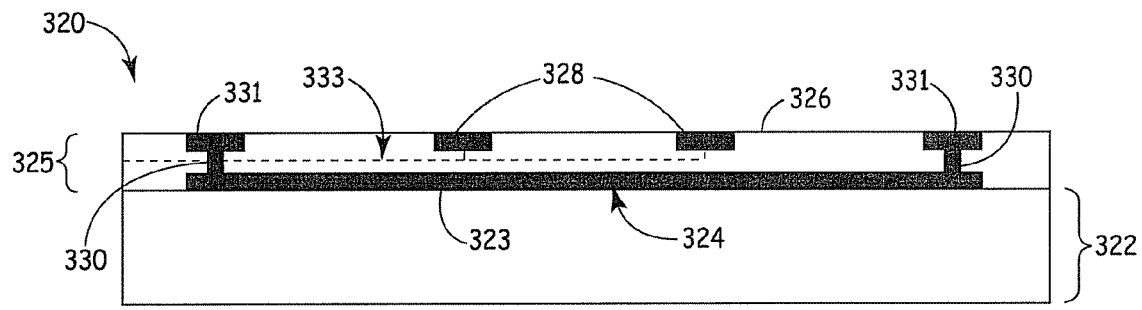
FIGS. 3A-3G are diagrams generally illustrating a process flow for constructing one embodiment of an apparatus such as generally shown in FIG. 1.

The process flow includes fabricating a wafer (e.g., a semiconductor wafer) or starting with a pre-fabbed foundry wafer that includes at least a first conductive portion 324 of the Faraday cage enclosure 300 formed at a location of a first Faraday cage portion 320. For example, as shown in FIG. 3A, the first Faraday cage portion 320 may include elements similar to those described herein with reference to the first Faraday cage portion 220 of FIG. 2. For example, the first Faraday cage portion 320 may include a substrate 322 (e.g., a doped or an undoped silicon wafer), at least one patterned metal layer 323 formed on the substrate 322 which provides a part of the first conductive portion 324 (e.g., the bottom portion) of the Faraday cage enclosure 300, and one or more additional layers 325 formed on the at least one patterned metal layer 323 terminating at a connection surface 326 that includes one or more conductive contact pads 328 for connection to the one or more device contacts 391 (e.g., through a solder connection). Further, for example, the first Faraday cage portion 320 may further include a plurality of conductive vias 330 formed in the one or more additional layers 325 to provide a part of the first conductive portion 324 of the Faraday cage enclosure 300. Each of the plurality of conductive vias 330 are in contact with the at least one patterned metal layer 323 and terminate in a via contact 331 at the connection surface 326 of the first Faraday cage portion 320.

For example, the wafer substrate 322 may be processed to form the first Faraday cage portion 320 by patterning at least one metal layer 323 on the wafer substrate 322 to provide a part of the first conductive portion 324 of the Faraday cage enclosure 300. Thereafter, the one or more additional layers 325 may be formed on the patterned metal layer 323 terminating at a connection surface 326 that includes the one or more conductive contact pads 328 corresponding to the one or more device contacts 391 of the circuit device 390 (e.g., the one or more additional layers 325 may provide an electrical interconnect shown schematically by dashed line 333 extending from one or more of the conductive contact pads 328 to a location outside of the Faraday cage enclosure 300). Further, for example, at least in one embodiment, connection surface 326 may include non-conductive portions, such as oxide material (e.g., in surface regions apart from one or more conductive portions of the connection surface 36, such as the one or more via contacts 331).

In addition, further, for example, the plurality of conductive vias 330 may be formed in the one or more additional layers 325 to provide a part of the first conductive portion 324 of the Faraday cage enclosure 300. The plurality of conductive vias 330 are in contact with the at least one patterned metal layer 323 and terminate in the via contacts 331 at the connection surface 326 of the first Faraday cage portion 320.

Figure 3B:
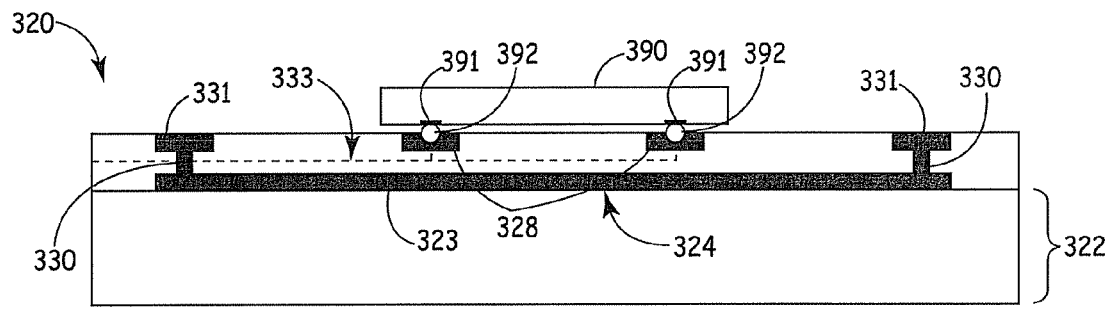

The one or more circuit devices 390 (e.g., die containing circuitry) may then be attached to the first Faraday cage portion 320 as shown in FIG. 3B. For example, the device contacts 391 may be electrically connected to the conductive contact pads 328 using solder balls 392 or other connection technique.

Figure 3C:
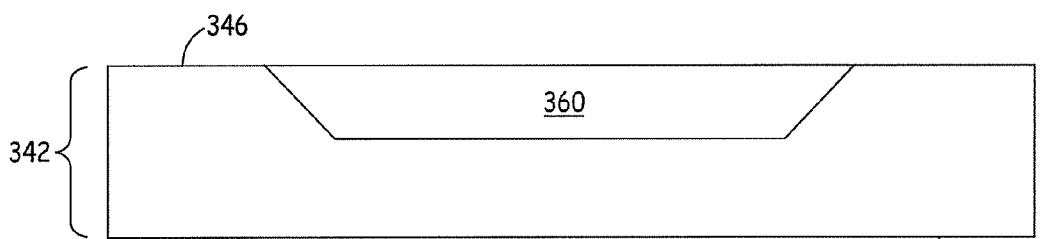
Figure 3D:
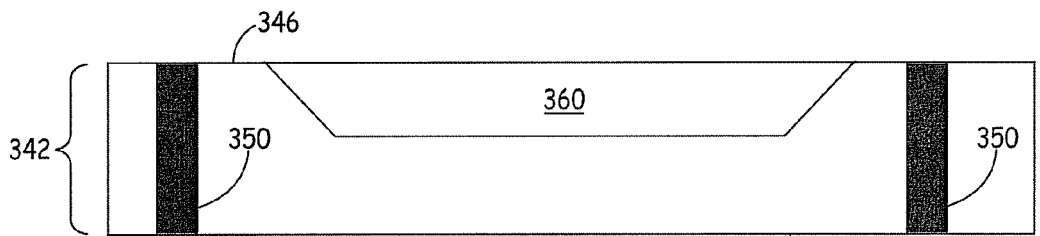
Figure 3E:
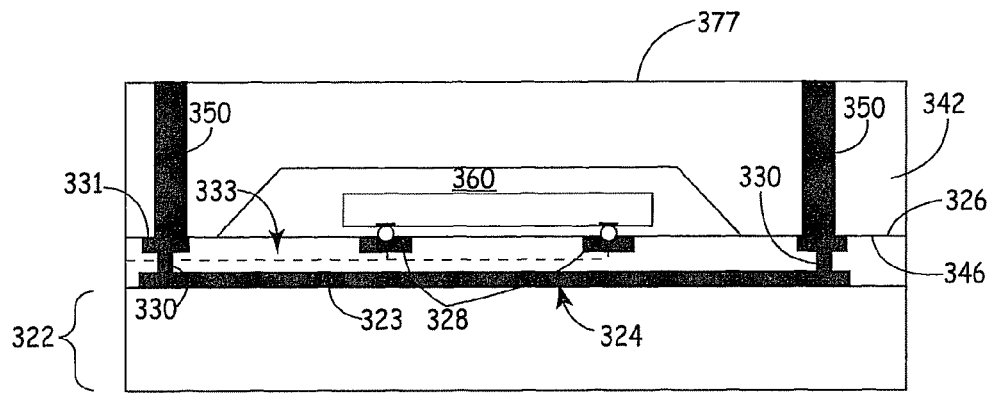
Figure 3F:
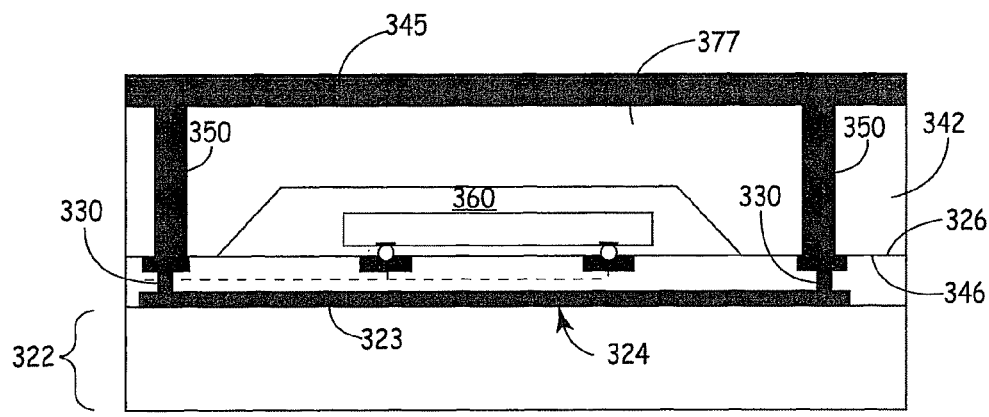
Figure 3G:
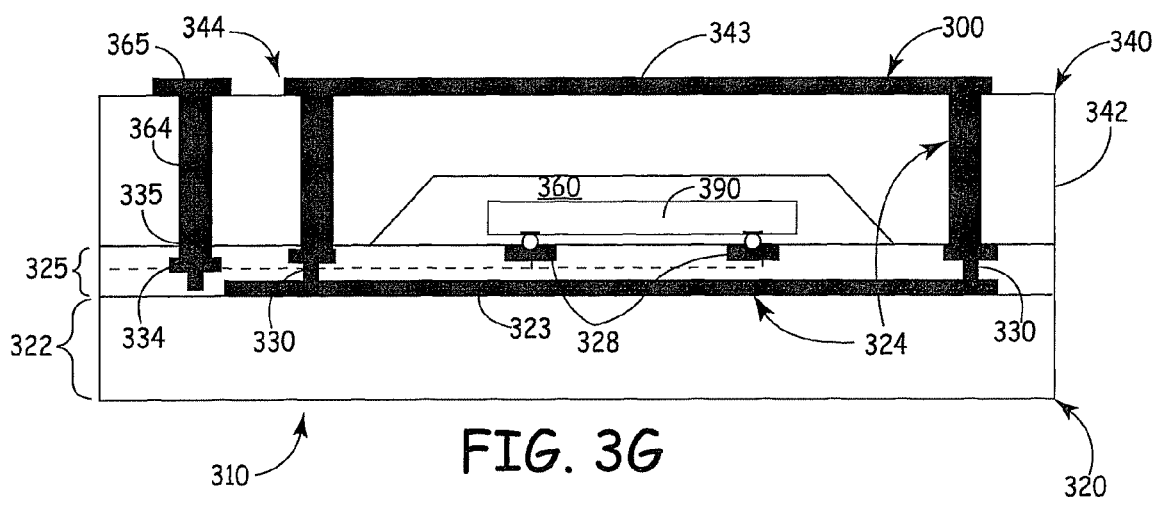

The process flow may further include forming at least a part of a second Faraday cage portion 340 (see FIG. 3G). For example, another wafer substrate 342 may be provided that includes a connection surface 346 and surface 377 opposite the connection surface 346 (e.g., such surfaces being the opposite sides of the semiconductor wafer substrate). A cavity 360 is then etched (e.g., dry or wet etched) in the connection surface 346 as shown in FIG. 3C. For example, in one embodiment, the cavity is sized for encapsulating the at least one circuit device 390 in the cavity 360.

Still further, in at least one embodiment and as shown in FIG. 3D, a plurality of conductive vias 350 are formed in the wafer substrate 342 corresponding to the plurality of conductive vias 330 of the first Faraday cage portion 320. Each of the plurality of conductive vias 350 extend between the connection surface 346 of the wafer substrate 342 and the surface 377 of the wafer substrate 342 opposite the connection surface 346. For example, at least in one embodiment a plurality of through vias 350 (e.g., through silicon vias) may be formed in the wafer substrate 342 (e.g., a silicon wafer substrate).

The connection surface 346 of the substrate 342 (e.g., having oxide material in surface regions apart from one or more conductive portions of the connection surface 346) may then be bonded, as shown in FIG. 3E, to the connection surface 326 of the first Faraday cage portion 320 such that the via contacts 331 of the plurality of conductive vias 330 of the first Faraday cage portion 320 are in electrical contact with the plurality of conductive vias 350 formed in the wafer substrate 342. For example, in one embodiment, the connection surfaces 326, 346 may be bonded using an oxide bonding process forming an oxide interface between the first Faraday cage portion 320 and the wafer substrate 342.

For example, the connection surfaces 326, 346 may each be polished or planarized (e.g., using a chemical mechanical planarization or polishing) to expose conductive locations on the surfaces 326, 346 but leaving an oxide on the remaining portion of such surfaces 326, 346. Thereafter, the first Faraday cage portion 320 may be aligned with the wafer substrate 342 to, for example, match the plurality of conductive vias 330 of the first Faraday cage portion 320 with the plurality of conductive vias 350. The oxide bond may then be performed resulting in bonded oxide portions in the interface and electrical connection of, for example, the plurality of conductive vias 330 of the first Faraday cage portion 320 and the plurality of conductive vias 350.

With the two components being bonded together, the surface 377 of the wafer substrate 342 may be metalized as shown in FIG. 3F. For example, at least one metal layer 345 may be formed on the surface 377. Thereafter, the metal layer 345 may be patterned and etched to provide patterned metal layer 343 as shown in FIG. 3G. The patterned metal layer 343 along with the plurality of conductive vias 350 provide a second conductive portion 344 of the Faraday cage enclosure 300 in the fabricated second Faraday cage portion 340.

As further shown in FIG. 3G, the process flow may also provide one or more interconnect vias 334 in the first Faraday cage portion 320 outside of the Faraday cage enclosure 300 and one or more interconnect vias 364 in the second Faraday cage portion 340 outside of the Faraday cage enclosure 300. For example, the one or more interconnect vias 334 in the first Faraday cage portion 320 may be formed in the same process flow as the electrical interconnect 333 or separately thereof. At least in one embodiment, the one or more interconnect vias 334 of the first Faraday cage portion 320 terminate in conductive pads 335 at the connection surface 326 of the first Faraday cage portion for connection (e.g., during oxide bonding of the cage portions) to the one or more interconnect vias 364 in the second Faraday cage portion 340. Further, for example, the one or more interconnect vias 364 in the second Faraday cage portion 340 extend through the substrate (e.g., are formed as through silicon vias with the holes of the vias through the substrate being formed in one process step) from the connection surface 346 to surface contacts 365 (e.g., such surface contacts 365 may be formed during the patterning of the metal layer 345). One or more insulative layers may be formed on patterned metal layer 343 (although not shown).

FIG. 4 is a schematic cross-sectional side view of another exemplary embodiment of an apparatus 410 providing a Faraday cage enclosure (represented schematically by dashed line 400) about at least one circuit device 490 (e.g., one or more circuits that include electrical circuitry). The circuit device 490 may include one or more device contacts 491 that may be connected to other conductive pads, such as conductive pads 428, for example, with solder material, such as solder balls 492.

The apparatus 410 further includes a first Faraday cage portion 420 that provides a first conductive portion 424 and a second Faraday cage portion 440 that provides a second conductive portion 444 of the Faraday cage enclosure 400 surrounding the at least one circuit device 490. The first Faraday cage portion 420 may include a conductive substrate 422 provided from or as a part of conductive wafer (e.g., a doped conductive silicon wafer or SOI wafer, such as with n-doped or p-doped silicon) which provides a part of the first conductive portion 424 (e.g., the bottom portion) of the Faraday cage enclosure 400.

Further, as shown in the exemplary schematic embodiment of FIG. 4, the first Faraday cage portion 420 includes one or more additional layers 425 formed on the conductive wafer 422 and terminating at a connection surface 426 that includes the one or more conductive contact pads 428 connected to the one or more device contacts 491 (e.g., through a solder connection).

The one or more additional layers 425 may include any number of layers desired for providing an electrical interconnect (schematically shown by dashed lines 433) extending from one or more of the conductive contact pads 428 to a location outside of the Faraday cage enclosure 400. For example, at least in one embodiment, the electrical interconnect 433 is a multilayer interconnect for providing interconnection of the pads 428 (and thus device 490) outside of the Faraday cage enclosure 400. Further, in at least one embodiment, the electrical interconnect 433 extends from one or more of the conductive contact pads 428 to a location outside of the Faraday cage enclosure 400 by passing through one or more insulated locations of the Faraday cage enclosure 400 (e.g., locations small enough to still maintain the mitigation of EMI). The electrical interconnect 433 can be terminated at a surface of the apparatus 410 (e.g., surface contacts as described with reference to FIGS. 1A-1B) in any number of manners (e.g., using one or more vias or additional interconnect structure).

The first Faraday cage portion 420 may further include a plurality of conductive vias 430 formed in the one or more additional layers 425 to provide a part of the first conductive portion 420 of the Faraday cage enclosure 400. Each of the plurality of conductive vias 430 are in electrical contact with the conductive semiconductor wafer 422 and terminate in a via contact 431 at the connection surface 426 of the first Faraday cage portion 420.

The second Faraday cage portion 440 of the apparatus 410 provides the second conductive portion 444 of the Faraday cage enclosure 400. The second Faraday cage portion 440 includes a conductive substrate 442 provided from or as a part of conductive wafer (e.g., a doped semiconductor wafer or doped silicon wafer). Further, as shown in the exemplary embodiment of FIG. 4, the conductive substrate 442 of the second Faraday cage portion 440 includes a connection surface 446 at a first side of the substrate 442 and a surface 477 on the other side of the substrate 442 opposite the connection surface 446. The conductive substrate 442 of the second Faraday cage portion 440 provides the second conductive portion 444 of the Faraday cage enclosure 400 (e.g., a top portion of the enclosure).

As shown in FIG. 4, a cavity 460 is defined in the connection surface 446 of the second Faraday cage portion 440 (e.g., wet or dry etched therein). The cavity 460 is sized to receive the at least one circuit device 490 for connection to the one or more of conductive contact pads 428 of the first Faraday cage portion 420.

Further, as shown in the exemplary embodiment of FIG. 4, the plurality of conductive vias 430 of the first Faraday cage portion 420 and conductive portions of the conductive semiconductor substrate 442 positioned adjacent such vias 430 are in electrical connection at the interface 496 between the first and second Faraday cage portions 420, 440. For example, when the connection surface 426 of the first Faraday cage portion 420 is bonded to the connection surface 446 of the second Faraday cage portion 440, the Faraday cage enclosure 400 is formed by the electrically connected first conductive portion 424 (e.g., provided by the conductive substrate 422 and the vias 430) and the second conductive portion 444 (e.g., provided by the conductive substrate 442).

The interface 496 between the connection surfaces 426, 446 of the first and second Faraday cage portions 420, 440 may include bonded oxide portions in locations other than where vias 430 (or other contacts) are being connected to the second Faraday cage portion 440. For example, such bonded oxide portions may be formed if an oxide bonding process is used to couple the Faraday cage portions (e.g., bonding oxide material of the connections surfaces 426, 446).

FIGS. 5A-5G are diagrams generally illustrating a process flow (e.g., a wafer scale process flow) for constructing one exemplary embodiment of an apparatus 510 (see FIG. 5G) such as, for example, generally shown in FIG. 1. The process provides a Faraday cage enclosure 500 for surrounding at least one circuit device 590 (e.g., the circuit device 590 may include one or more device contacts 591 that may be connected to other conductive pads, such as conductive pads 528, for example, with solder material, such as solder balls 592).

Figure 5A:
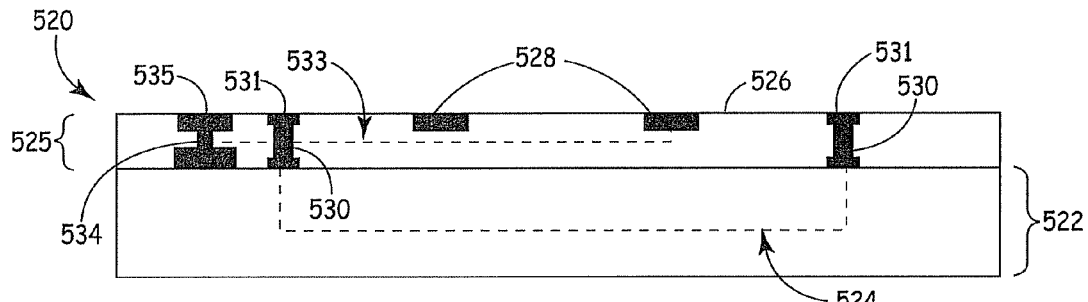
FIGS. 5A-5G are diagrams generally illustrating a process flow for constructing another embodiment of an apparatus such as generally shown in FIG. 1.

The process flow may include fabricating a wafer (e.g., a doped semiconductor wafer) or starting with a pre-fabbed foundry wafer that includes at least a first conductive portion 524 of the Faraday cage enclosure 500 formed at a location of a first Faraday cage portion 520. For example, as shown in FIG. 5A, the first Faraday cage portion 520 may include elements similar to those described herein with reference to the first Faraday cage portion 420 of FIG. 4. For example, the first Faraday cage portion 520 may include a conductive substrate 522 (e.g., a doped silicon wafer) which provides a part of the first conductive portion 524 (e.g., the bottom portion) of the Faraday cage enclosure 500, and one or more additional layers 525 formed on the conductive substrate 522 terminating at a connection surface 526 that includes the one or more conductive contact pads 528 for connection to the one or more device contacts 591 (e.g., through a solder connection). Further, for example, the first Faraday cage portion 520 may further include a plurality of conductive vias 530 fowled in the one or more additional layers 525 to provide a part of the first conductive portion 524 of the Faraday cage enclosure 500. Each of the plurality of conductive vias 530 are in electrical contact with the conductive substrate 522 and terminate in a via contact 531 at the connection surface 526 of the first Faraday cage portion 520.

For example, the conductive wafer substrate 522 may be processed to form the first Faraday cage portion 520 by fabricating (e.g., using any known fabrication processes including deposition, patterning, and/or etching) the one or more additional layers 525 on the conductive substrate 522 terminating at a connection surface 526 that includes the one or more conductive contact pads 528 (e.g., the one or more additional layers 525 providing an electrical interconnect shown schematically by dashed line 533 extending from one or more of the conductive contact pads 528 to a location outside of the Faraday cage enclosure 500). In addition, the plurality of conductive vias 530 may be formed in the one or more additional layers 525 to provide a part of the first conductive portion 524 of the Faraday cage enclosure 500. The plurality of conductive vias 530 are in contact with the conductive substrate 522 and terminate in the via contacts 531 at the connection surface 526 of the first Faraday cage portion 520.

As further shown in FIG. 5A, the process flow may also provide one or more interconnect vias 534 in the first Faraday cage portion 520 outside of the Faraday cage enclosure 500 for connection to one or more interconnect vias 564 in the second Faraday cage portion 540 (See FIG. 5D) outside of the Faraday cage enclosure 500. For example, the one or more interconnect vias 534 in the first Faraday cage portion 520 may be formed in the same process flow as the electrical interconnect 531 or separately thereof. At least in one embodiment, the one or more interconnect vias 534 of the first Faraday cage portion 520 terminate in conductive pads 525 at the connection surface 526 of the first Faraday cage portion for connection (e.g., during oxide bonding of the cage portions) to the one or more interconnect vias 564 in the second Faraday cage portion 540 (see FIG. 5G).

Figure 5B:
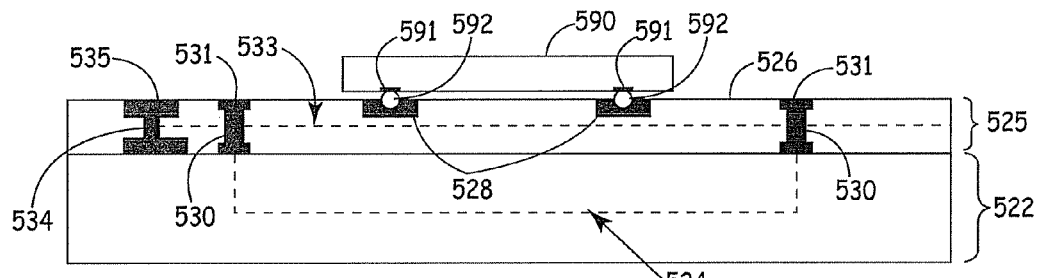

The one or more circuit devices 590 (e.g., die containing circuitry) may then be attached to the first Faraday cage portion 520 as shown in FIG. 5B. For example, the device contact 591 may be electrically connected to the conductive contact pads 528 using solder balls 592 or other connection technique.

Figure 5C:
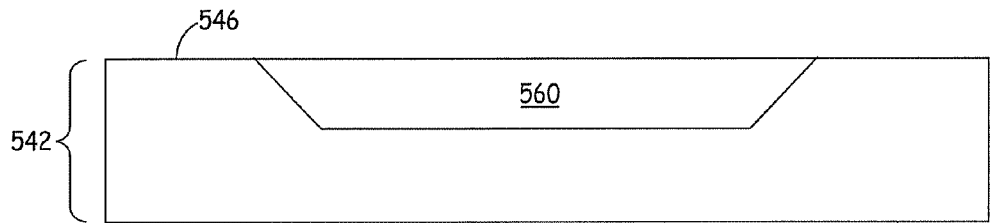

The process flow may further include forming at least a part of a second Faraday cage portion 540 (see FIG. 3G). For example, another conductive wafer substrate 542 may be provided that includes a connection surface 546 and surface 577 opposite the connection surface 546 (e.g., such surfaces being the opposite sides of the semiconductor wafer substrate). A cavity 560 is then etched (e.g., dry or wet etched) in the connection surface 546 as shown in FIG. 5C. For example, in one embodiment, the cavity 560 is sized for encapsulating the at least one circuit device 590 in the cavity 560.

Figure 5D:
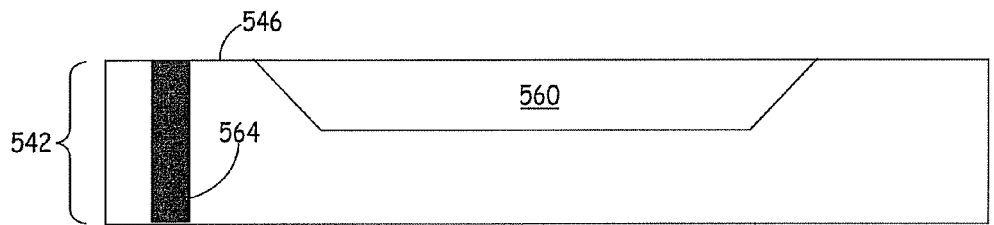

Still further, in at least one embodiment and as shown in FIG. 5D, the one or more interconnect vias 564 may be forming in the second Faraday cage portion 540 corresponding to the interconnect vias 534 of the first Faraday cage portion 520. Such interconnect vias 564 may, for example, extend through the semiconductor substrate 542 (e.g., are formed as through silicon vias) from the connection surface 546 to surface 577 (e.g., for connection to surface contacts 565 as shown in FIG. 5G).

Figure 5E:
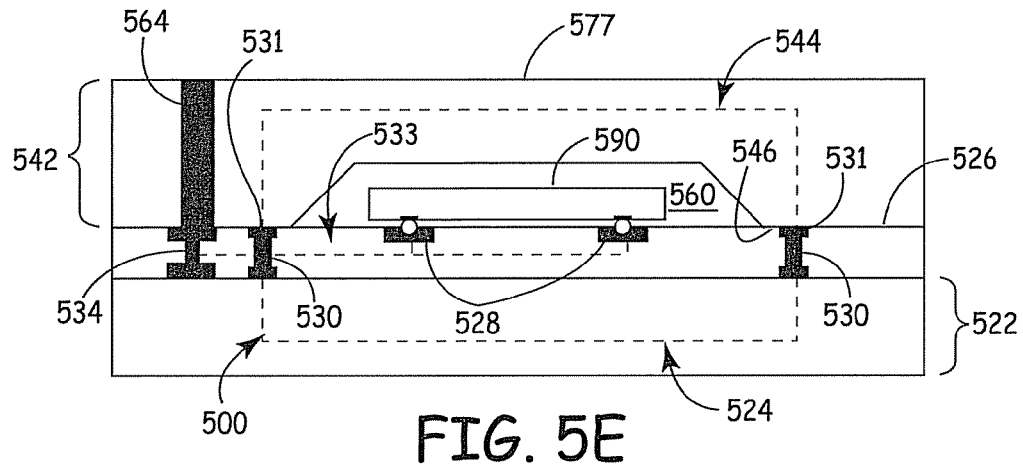

The connection surface 546 of the substrate 542 may then be bonded, as shown in FIG. 5E, to the connection surface 526 of the first Faraday cage portion 520 such that the via contacts 531 of the plurality of conductive vias 530 of the first Faraday cage portion 520 are in electrical contact with the conductive wafer substrate 542. For example, in one embodiment, the connection surfaces 526, 546 may be bonded using an oxide bonding process forming an oxide interface between the first Faraday cage portion 520 and the wafer substrate 542 in a similar manner to that described with reference to FIGS. 3A-3G. For example, the connection surfaces 526, 546 may each be etched, polished or planarized (e.g., using a chemical mechanical planarization or polishing) to expose conductive locations on the surfaces 526, 546 but leaving an oxide on the remaining portion of such surfaces 526, 546. Thereafter, the first Faraday cage portion 520 may be aligned with the wafer substrate 542 to, for example, match the plurality of conductive vias 530 of the first Faraday cage portion 520 with exposed conductive portions of the conductive wafer substrate 542 (e.g., exposed portions not having an oxide, such as native oxide, or any other oxide, thereon). The oxide bond may then be performed resulting in bonded oxide portions in the interface and electrical connection of, for example, the plurality of conductive vias 530 of the first Faraday cage portion 520 and the exposed conductive portions of the wafer substrate 542.

Figure 5F:
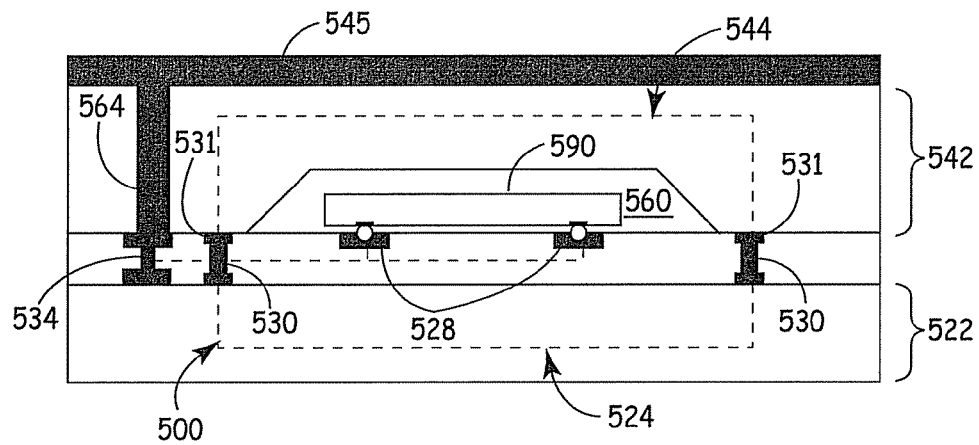

With the two components being bonded together, the surface 577 of the wafer substrate 542 may be metalized as shown in FIG. 5F. For example, at least one metal layer 545 may be formed on the surface 577. Thereafter, the metal layer 545 may be patterned and etched to provide patterned surface contacts 565 as shown in FIG. 5G.

Figure 5G:
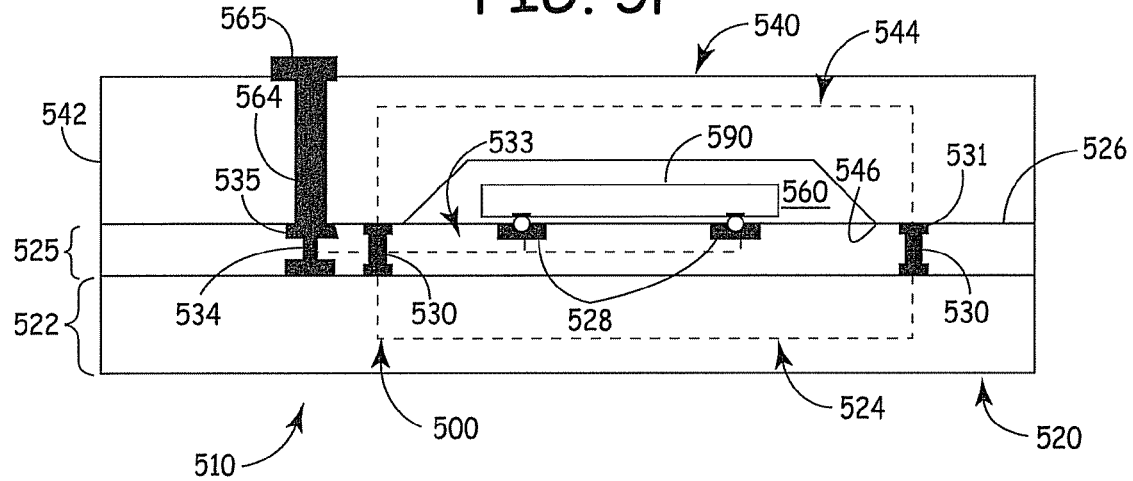

As further shown in FIG. 5G, the bonding may also provide electrical connection between the one or more interconnect vias 534 in the first Faraday cage portion 520 outside of the Faraday cage enclosure 500 and one or more interconnect vias 564 in the second Faraday cage portion 540 outside of the Faraday cage enclosure 500. In such a manner, for example, the one or more interconnect vias 564 and the one or more interconnect vias 534 provide connection of the surface contacts 565 to the conductive pads 528 upon which the at least one circuit device 590 is connected.

The process flows presented in FIGS. 3A-3G and 5A-5G are only examples of process flows that may be used to implement the provision of a Faraday cage and is not to be taken as limiting to the scope of the disclosure provided herein. Various modifications to the process steps and/or timing or order of the process steps may be made to the process flow while still providing the benefits of a Faraday cage. For example, the metallization of one or more surfaces may be performed after the oxide bonding, the etching of the cavity may be performed after the formation of one or more portions of conductive vias forming a part of the Faraday cage enclosure, etc.

All patents, patent documents, and references cited herein are incorporated in their entirety as if each were incorporated separately. This disclosure has been provided with reference to illustrative embodiments and is not meant to be construed in a limiting sense. As described previously, one skilled in the art will recognize that other various illustrative applications may use the techniques as described herein to take advantage of the beneficial characteristics of the apparatus and methods described herein. Various modifications of the illustrative embodiments, as well as additional embodiments of the disclosure, will be apparent upon reference to this description.

The invention claimed is:

1. An apparatus comprising:
    at least one circuit device comprising electrical circuitry;
    a first Faraday cage portion comprising a first conductive portion of a Faraday cage enclosure surrounding the at least one circuit device, the first Faraday cage portion comprising:
        a substrate, wherein the substrate is provided from a wafer,
        at least one patterned metal layer formed on the substrate providing a part of the first conductive portion of the Faraday cage enclosure,
        one or more additional layers formed on the at least one patterned metal layer terminating at a connection surface, wherein the one or more additional layers provide an electrical interconnect connected to the at least one circuit device and extending to a location outside of the Faraday cage enclosure, and
        a plurality of conductive vias formed in the one or more additional layers providing a part of the first conductive portion of the Faraday cage enclosure, wherein each of the plurality of conductive vias are in contact with the at least one patterned metal layer and terminate in a via contact at the connection surface of the first Faraday cage portion; and
    a second Faraday cage portion comprising a second conductive portion of the Faraday cage enclosure surrounding the at least one circuit device, the second Faraday cage portion comprising:
        a substrate, wherein the substrate is provided from a wafer,
        a plurality of conductive vias formed in the substrate corresponding to the plurality of conductive vias of the first Faraday cage portion providing a part of the second conductive portion of the Faraday cage enclosure,
        wherein each of the plurality of conductive vias of the second Faraday cage portion extend between a connection surface of the substrate of the second Faraday cage portion and a surface of the substrate opposite the connection surface, and
        at least one patterned metal layer formed on the surface of the substrate opposite the connection surface of the substrate of the second Faraday cage portion and in electrical contact with the plurality of conductive vias of the second Faraday cage providing a part of the second conductive portion of the Faraday cage enclosure,
    wherein the plurality of conductive vias of the first Faraday cage portion and the plurality of conductive vias of the second Faraday cage portion are in electrical connection when the connection surface of the first Faraday cage portion is coupled to the connection surface of the second Faraday cage portion such that the Faraday cage enclosure is formed by the first conductive portion and the second conductive portion.

2. The apparatus of claim 1, wherein the apparatus further comprises one or more interconnect vias formed in at least one of the first and second Faraday cage portions outside of the Faraday cage enclosure and terminating at one or more surface contacts at a surface of at least one of the first and second Faraday cage portions, wherein the electrical interconnect passes through one or more insulated locations of the Faraday cage enclosure to connect to the one or more interconnect vias.

3. The apparatus of claim 1, wherein the plurality of conductive vias formed in the substrate of the second Faraday cage portion comprise vias extending through the substrate.

4. The apparatus of claim 1, wherein the connection surface of the first Faraday cage portion is oxide bonded to the connection surface of the second Faraday cage portion such that the Faraday cage enclosure is formed by the first conductive portion and the second conductive portion.

5. The apparatus of claim 1, wherein the at least one circuit device comprises one or more device contacts, wherein the connection surface of the first Faraday cage portion comprises one or more conductive contact pads connected to the one or more device contacts, wherein the electrical interconnect extends from the one or more conductive contact pads connected to the one or more device contacts to a location outside the Faraday cage enclosure, and further wherein a cavity is defined in the connection surface of the second Faraday cage portion, and further wherein the cavity is sized to receive the circuit device for connection of the one or more device contacts thereof to the one or more conductive contact pads of the first Faraday cage portion.

6. The apparatus of claim 1, wherein the apparatus forms a part of an implantable medical device.

7. A method of providing a Faraday cage enclosure for surrounding at least one circuit device, wherein the at least one circuit device comprises electrical circuitry, wherein the method comprises:
    providing a first Faraday cage portion comprising a first conductive portion of a Faraday cage enclosure, wherein providing the first Faraday cage portion comprises:
        providing a wafer substrate,
        providing at least one patterned metal layer on the wafer substrate to provide a part of the first conductive portion of the Faraday cage enclosure,
        providing one or more additional layers on the at least one patterned metal layer terminating at a connection surface, wherein the one or more additional layers provide an electrical interconnect for connecting the at least one circuit device to a location outside of the Faraday cage enclosure, and
        providing a plurality of conductive vias in the one or more additional layers providing a part of the first conductive portion of the Faraday cage enclosure, wherein each of the plurality of conductive vias are in contact with the at least one patterned metal layer and terminate in a via contact at the connection surface of the first Faraday cage portion;
    providing a second Faraday cage portion comprising a second conductive portion of the Faraday cage enclosure, wherein providing the second Faraday cage portion comprises:
        providing a wafer substrate,
        forming a plurality of conductive vias in the wafer substrate corresponding to the plurality of conductive vias of the first conductive portion to provide a part of the second conductive portion of the Faraday cage enclosure, wherein each of the plurality of conductive vias of the second Faraday cage portion extend between a connection surface of the semiconductor wafer substrate of the second Faraday cage portion and a surface of the wafer substrate opposite the connection surface, and patterning at least one metal layer formed on the surface of the wafer substrate opposite the connection surface of the wafer substrate of the second Faraday cage and in electrical contact with the plurality of conductive vias of the second Faraday cage providing a part of the second conductive portion of the Faraday cage enclosure; and bonding the connection surface of the first Faraday cage portion to the connection surface of the second Faraday cage portion such that the via contacts of the plurality of conductive vias of the first Faraday cage portion are in electrical contact with the plurality of conductive vias of the second Faraday cage portion to form the Faraday cage enclosure comprising the first conductive portion and the second conductive portion.

8. The method of claim 7, wherein the method further comprises forming one or more interconnect vias in at least one of the first and second Faraday cage portions outside of the Faraday cage enclosure and terminating at one or more surface contacts at a surface of at least one of the first and second Faraday cage portions, wherein the electrical interconnect passes through one or more insulated locations of the Faraday cage enclosure to connect to the one or more additional interconnect vias.

9. The method of claim 7, wherein forming the plurality of conductive vias in the wafer substrate of the second Faraday cage portion comprises forming vias extending through the wafer substrate.

10. The method of claim 7, wherein bonding the connection surface of the first Faraday cage portion to the connection surface of the second Faraday cage portion comprises using an oxide bond to bond oxide material of the connection surfaces of the first and second Faraday cage portions.

11. The method of claim 7, wherein the at least one circuit device comprises one or more device contacts, wherein the connection surface of the first Faraday cage portion comprises one or more conductive contact pads corresponding to the one or more device contacts of the at least one circuit device, wherein the electrical interconnect extends from the one or more conductive contact pads to a location outside the Faraday cage enclosure, and wherein the method further comprises positioning the at least one circuit device relative to the first Faraday cage portion to electrically connect the one or more device contacts to the one or more conductive contact pads of the first Faraday cage portion, wherein the at least one circuit device is positioned in a cavity defined in the connection surface of the second Faraday cage portion.

12. An apparatus comprising:
at least one circuit device comprising electrical circuitry;
a first Faraday cage portion comprising a first conductive portion of a Faraday cage enclosure surrounding the at least one circuit device, the first Faraday cage portion comprising:
a conductive substrate, wherein the conductive substrate is provided from a wafer, wherein the conductive substrate provides a part of the first conductive portion of the Faraday cage enclosure,
one or more layers formed on the conductive substrate terminating at a connection surface, wherein the one or more layers provide an electrical interconnect connected to the at least one circuit device and extending to a location outside of the Faraday cage enclosure, and
a plurality of conductive vias formed in the one or more layers providing a part of the first conductive portion of the Faraday cage enclosure, wherein each of the plurality of conductive vias are in electrical contact with the conductive substrate and terminate in a via contact at the connection surface of the first Faraday cage portion; and a second Faraday cage portion comprising a second conductive portion of the Faraday cage enclosure surrounding the at least one circuit device, the second Faraday cage portion comprising a conductive substrate, wherein the conductive substrate comprises a connection surface and a surface of the conductive substrate opposite the connection surface, wherein the conductive substrate is provided from a wafer, wherein the conductive semiconductor substrate provides the second conductive portion of the Faraday cage enclosure, and further wherein the via contacts of the plurality of conductive vias of the first Faraday cage portion are in electrical contact with conductive portions of the connection surface of the conductive substrate of the second Faraday cage portion such that the Faraday cage enclosure is formed by the first conductive portion and the second conductive portion.

13. The apparatus of claim 12, wherein the apparatus further comprises one or more interconnect vias formed in at least one of the first and second Faraday cage portions outside of the Faraday cage enclosure and terminating at one or more surface contacts at a surface of at least one of the first and second Faraday cage portions, wherein the electrical interconnect passes through one or more insulated locations of the Faraday cage enclosure to connect to the one or more interconnect vias.

14. The apparatus of claim 13, wherein the one or more interconnect vias comprise at least one or more vias extending through the conductive substrate of the second Faraday cage portion terminating at one or more surface contacts formed at the surface of the conductive substrate of the second Faraday cage portion opposite the connection surface.

15. The apparatus of claim 12, the at least one circuit device comprises one or more device contacts, wherein the connection surface of the first Faraday cage portion comprises one or more conductive contact pads connected to the one or more device contacts, wherein the electrical interconnect extends from the one or more conductive contact pads connected to the one or more device contacts to a location outside the Faraday cage enclosure, and further wherein a cavity is defined in the connection surface of the second Faraday cage portion, and further wherein the cavity is sized to receive the circuit device for connection of the one or more device contacts thereof to the one or more conductive contact pads of the first Faraday cage portion.

16. The apparatus of claim 12, wherein the conductive substrate of at least the second Faraday cage portion is provided from a doped semiconductor substrate, and further wherein the connection surface of the first Faraday cage portion is oxide bonded to the connection surface of the second Faraday cage portion such that the Faraday cage enclosure is formed by the first conductive portion and the second conductive portion.

17. The apparatus of claim 12, wherein the at least one circuit device forms a part of an implantable medical device.

18. A method of providing a Faraday cage enclosure for surrounding at least one circuit device, wherein the at least one circuit device comprises electrical circuitry, wherein the method comprises:

provided a first Faraday cage portion comprising a first conductive portion of a Faraday cage enclosure, wherein providing the first Faraday cage portion comprises:

providing a conductive wafer substrate, wherein the conductive wafer substrate provides a part of the first conductive portion of the Faraday cage enclosure, providing one or more layers on the conductive wafer substrate terminating at a connection surface, wherein the one or more layers provide an electrical interconnect for connecting the at least one circuit device to a location outside of the Faraday cage enclosure, and providing a plurality of conductive vias in the one or more layers providing a part of the first conductive portion of the Faraday cage enclosure, wherein each of the plurality of conductive vias are in contact with the conductive wafer substrate and terminate in a via contact at the connection surface of the first Faraday cage portion;

providing a second Faraday cage portion comprising a second conductive portion of the Faraday cage enclosure, wherein providing the second Faraday cage portion comprises providing a conductive wafer substrate, wherein the conductive wafer substrate comprises a connection surface and a surface of the conductive wafer substrate opposite the connection surface, wherein the conductive wafer substrate provides the second conductive portion of the Faraday cage enclosure; and bonding the connection surface of the first Faraday cage portion to the connection surface of the second Faraday cage portion such that the via contacts of the plurality of conductive vias of the first Faraday cage portion are in electrical contact with conductive portions of the connection surface of the conductive wafer substrate of the second Faraday cage portion to form the Faraday cage enclosure comprising the first conductive portion and the second conductive portion.

19. The method of claim 18, wherein the at least one circuit device comprises one or more device contacts, wherein the connection surface of the first Faraday cage portion comprises one or more conductive contact pads corresponding to the one or more device contacts of the at least one circuit device, wherein the electrical interconnect extends from the one or more conductive contact pads to a location outside the Faraday cage enclosure, and wherein the method further comprises positioning the at least one circuit device relative to the first Faraday cage portion to electrically connect the one or more device contacts to the one or more conductive contact pads of the first Faraday cage portion, wherein the at least one circuit device is positioned in a cavity defined in the connection surface of the second Faraday cage portion.

20. The method of claim 18, wherein the method further comprises forming one or more interconnect vias in at least one of the first and second Faraday cage portions outside of the Faraday cage enclosure and terminating at one or more surface contacts at a surface of at least one of the first and second Faraday cage portions, wherein the electrical interconnect passes through one or more insulated locations of the Faraday cage enclosure to connect to the one or more interconnect vias.

21. The method of claim 20, wherein forming one or more interconnect vias comprises forming one or more vias extending through the conductive wafer substrate of the second Faraday cage portion terminating at one or more surface contacts formed at the surface of the conductive wafer substrate of the second Faraday cage opposite the connection surface.

22. The method of claim 18, wherein providing the conductive wafer substrate of the second Faraday cage portion comprises providing a doped semiconductor wafer substrate, and further wherein bonding the connection surface of the first Faraday cage portion to the connection surface of the second Faraday cage portion comprises using an oxide bond to bond oxide material of the connection surfaces of the first and second Faraday cage portions.

23. An apparatus comprising:

at least one circuit device comprising electrical circuitry;

a first Faraday cage portion comprising a first conductive portion of a Faraday cage enclosure surrounding the at least one circuit device, the first Faraday cage portion comprising a substrate provided from a wafer, wherein the first Faraday cage portion comprises a connection surface, wherein the connection surface comprises one or more conductive contact portions terminating the first conductive portion of the Faraday cage enclosure and surface portions comprising oxide material;

a second Faraday cage portion comprising a second conductive portion of the Faraday cage enclosure surrounding the at least one circuit device, the second Faraday cage portion comprising a substrate provided from a wafer, wherein the second Faraday cage portion comprises a connection surface, wherein the connection surface comprises one or more conductive contact portions terminating the second conductive portion of the Faraday cage enclosure and surface portions comprising oxide material, wherein the one or more conductive contact portions of the connection surface of the first Faraday cage portion are aligned with the one or more conductive contact portions of the connection surface of the second Faraday cage portion, and further wherein the oxide material of the connection surface of the first Faraday cage portion is bonded to the oxide material of the connection surface of the second Faraday cage portion to provide a bonded oxide interface therebetween while an electrical connection is provided between the one or more conductive contact portions of the connection surface of the first Faraday cage portion and the one or more conductive contact portions of the connection surface of the second Faraday cage portion to form the Faraday cage enclosure.

24. The apparatus of claim 23, wherein at least one of the first and second conductive portions forming the Faraday cage enclosure comprises one or more through silicon vias.

25. The apparatus of claim 23, wherein the apparatus further comprises:

one or more interconnect vias formed in at least one of the first and second Faraday cage portions outside of the Faraday cage enclosure and terminating at one or more surface contacts at a surface of at least one of the first and second Faraday cage portions, wherein at least one of the one or more interconnect vias comprises a through silicon via formed in at least one of the first and second Faraday cage portions; and an electrical interconnect extending from one or more conductive contact pads located on one of the connections surfaces of the first and second Faraday cage portions connected to one or more device contacts of the circuit device to a location outside of the Faraday cage enclosure, wherein the electrical interconnect is electrically connected to at least one of the one or more interconnect vias.

26. The apparatus of claim 25, wherein the apparatus further comprises a cavity defined in the connection surface of at least one of the first and second Faraday cage portions, wherein the cavity is sized to receive the circuit device.

27. A method of providing a Faraday cage enclosure for surrounding at least one circuit device, the method comprising:
    providing a first Faraday cage portion comprising a first conductive portion of a Faraday cage enclosure surrounding the at least one circuit device, the first Faraday cage portion comprising a substrate, wherein the first Faraday cage portion comprises a connection surface, wherein the connection surface comprises one or more conductive contact portions terminating the first conductive portion of the Faraday cage enclosure and surface portions comprising oxide material;
    providing a second Faraday cage portion comprising a second conductive portion of the Faraday cage enclosure surrounding the at least one circuit device, the second Faraday cage portion comprising a substrate, wherein the second Faraday cage portion comprises a connection surface, wherein the connection surface comprises one or more conductive contact portions terminating the second conductive portion of the Faraday cage enclosure and surface portions comprising oxide material;
    aligning the one or more conductive contact portions of the connection surface of the first Faraday cage portion with the one or more conductive contact portions of the connection surface of the second Faraday cage portion; and
    bonding the oxide material of the connection surface of the first Faraday cage portion to the oxide material of the connection surface of the second Faraday cage portion while providing an electrical connection between the one or more conductive contact portions of the connection surface of the first Faraday cage portion and the one or more conductive contact portions of the connection surface of the second Faraday cage portion to form the Faraday cage enclosure.

28. The method of claim 27, wherein providing at least one of the first and second conductive portions of the first and second Faraday cage portions comprises forming at least one or more through silicon vias.

29. The method of claim 27, wherein providing at least one of the first and second Faraday cage portions comprises:
    providing one or more interconnect vias formed in at least one of the first and second Faraday cage portions outside of the Faraday cage enclosure and terminating at one or more surface contacts at a surface of at least one of the first and second Faraday cage portions, wherein providing the one or more interconnect vias formed in at least one of the first and second Faraday cage portions outside of the Faraday cage enclosure comprises forming at least one through silicon via in at least one of the first and second Faraday cage portions; and
    providing an electrical interconnect extending from one or more conductive contact pads located on one of the connection surfaces of the first and second Faraday cage portions connected to one or more device contacts of the circuit device to a location outside of the Faraday cage enclosure, wherein the electrical interconnect is electrically connected to at least one of the one or more interconnect vias.

30. The method of claim 29, wherein the method further comprises positioning the circuit device in a cavity defined in the connection surface of at least one of the first and second Faraday cage portions.

* * * * *